United States Patent
Jung

(10) Patent No.: US 9,825,236 B2
(45) Date of Patent: Nov. 21, 2017

(54) ORGANIC LIGHT EMITTING DEVICE AND DISPLAY DEVICE INCLUDING THE SAME

(71) Applicant: SAMSUNG DISPLAY CO., LTD., Yongin, Gyeonggi-Do (KR)

(72) Inventor: Jiyun Jung, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 314 days.

(21) Appl. No.: 14/661,344

(22) Filed: Mar. 18, 2015

(65) Prior Publication Data

US 2016/0020407 A1  Jan. 21, 2016

(30) Foreign Application Priority Data

Jul. 17, 2014  (KR) .................. 10-2014-0090528

(51) Int. Cl.
*H01L 51/00* (2006.01)
*H01L 51/50* (2006.01)

(52) U.S. Cl.
CPC ........ *H01L 51/0067* (2013.01); *H01L 51/006* (2013.01); *H01L 51/0056* (2013.01); *H01L 51/0055* (2013.01); *H01L 51/0058* (2013.01); *H01L 51/5012* (2013.01); *H01L 51/5072* (2013.01)

(58) Field of Classification Search
None
See application file for complete search history.

(56) References Cited

U.S. PATENT DOCUMENTS

2014/0027723 A1* 1/2014 Kim .................. H01L 51/0058 257/40
2014/0246657 A1* 9/2014 Kim .................. H01L 51/0058 257/40

FOREIGN PATENT DOCUMENTS

JP  H10-017860 A  1/1998
JP  H11-087067 A  3/1999
(Continued)

OTHER PUBLICATIONS

Martin et al. Bulletin des Societes CHimiques Belges, 1951, 60, 325-332.*

*Primary Examiner* — Robert S Loewe
(74) *Attorney, Agent, or Firm* — Lee & Morse, P.C.

(57) ABSTRACT

An organic light emitting device and a display device, the organic light emitting device including an anode; an emission layer on the anode, the emission layer including a first compound represented by the following Formula 1; an electron transport layer on the emission layer, the electron transport layer including a second compound and the second compound being an indenofluorene derivative; and a cathode on the electron transport layer,

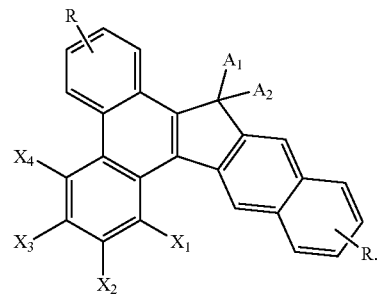

[Formula 1]

20 Claims, 5 Drawing Sheets

(56) References Cited

FOREIGN PATENT DOCUMENTS

| JP | H11-345686 | A | 12/1999 |
|----|------------|---|---------|
| JP | 2011-238922 | A | 11/2011 |
| KR | 10-0989621 | B1 | 10/2010 |
| KR | 10-1176261 | B1 | 8/2012 |
| KR | 10-2013-0110347 | A | 10/2013 |
| KR | 10-1412956 | B1 | 7/2014 |
| WO | WO 2011/060877 | A3 | 5/2011 |

\* cited by examiner

ORGANIC LIGHT EMITTING DEVICE AND DISPLAY DEVICE INCLUDING THE SAME

CROSS-REFERENCE TO RELATED APPLICATION

Korean Patent Application No. 10-2014-0090528, filed on Jul. 17, 2014, in the Korean Intellectual Property Office, and entitled: "Organic Light Emitting Device and Display Device Including the Same," is incorporated by reference herein in its entirety.

BACKGROUND

1. Field

Embodiments relate to an organic light emitting device and a display device including the same.

2. Description of the Related Art

Flat display devices may include a light emitting type device or a light receiving type device. The light emitting type device may include, e.g., a flat cathode ray tube, a plasma display panel, an organic light emitting device (OLED), etc. The OLED is a self-luminous display device having merits such as wide viewing angles, excellent contrast, and rapid response time.

Therefore, the OLED may be applied in a display device for a mobile apparatus including, e.g., a digital camera, a video camera, a camcorder, a personal digital assistant, a smart phone, an ultra slim laptop, a tablet personal computer, a flexible display device, etc. or a large-sized electronic and electric product such as an ultra slim television and is highly favored.

The OLED displays color based on the principle of recombining of holes and electrons injected in an anode and a cathode in an organic emission layer and emitting light. Excitons obtained by the combination of the injected holes and electrons emit light while being dropped from an excited state to a ground state.

SUMMARY

Embodiments are directed to an organic light emitting device and a display device including the same.

The embodiments may be realized by providing an organic light emitting device including an anode; an emission layer on the anode, the emission layer including a first compound represented by the following Formula 1; an electron transport layer on the emission layer, the electron transport layer including a second compound and the second compound being an indenofluorene derivative; and a cathode on the electron transport layer,

[Formula 1]

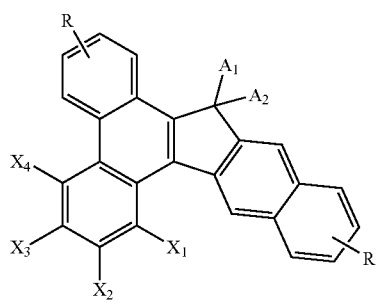

wherein, in Formula 1: $X_1$ to $X_4$ are each independently selected from the group of a substituted or unsubstituted arylamino group having 6 to 24 carbon atoms, a substituted or unsubstituted aryl group having 6 to 24 carbon atoms, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 1 to 24 carbon atoms, a substituted or unsubstituted alkoxy group having 1 to 24 carbon atoms, a cyano group, a halogen group, a substituted or unsubstituted aryloxy group having 6 to 24 carbon atoms, a substituted or unsubstituted alkylsilyl group having 1 to 24 carbon atoms, a substituted or unsubstituted arylsilyl group having 6 to 24 carbon atoms, deuterium, and hydrogen, and R, $A_1$, and $A_2$ are each independently selected from the group of hydrogen, a substituted or unsubstituted aryl group having 6 to 24 carbon atoms, a substituted or unsubstituted heteroaryl group having 1 to 24 carbon atoms, and a substituted or unsubstituted cycloalkyl group having 3 to 24 carbon atoms.

In the case that any of $X_1$ to $X_4$, R, $A_1$, and $A_2$ in the first compound are substituted, $X_1$ to $X_4$, R, $A_1$, or $A_2$ may be independently selected from the group of an aryl group having 6 to 24 carbon atoms, a heteroaryl group having 2 to 24 carbon atoms, an alkyl group having 1 to 24 carbon atoms, a heteroalkyl group having 1 to 24 carbon atoms, a cycloalkyl group having 3 to 24 carbon atoms, an alkoxy group having 1 to 24 carbon atoms, a cyano group, a halogen group, an aryloxy group having 6 to 24 carbon atoms, an alkylsilyl group having 1 to 24 carbon atoms, an arylsilyl group having 6 to 24 carbon atoms, deuterium, and hydrogen.

The first compound may be a compound represented by the one of the following Formulae BD1 to BD6:

BD1

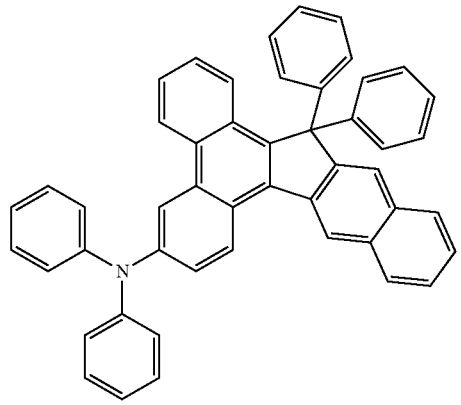

BD2

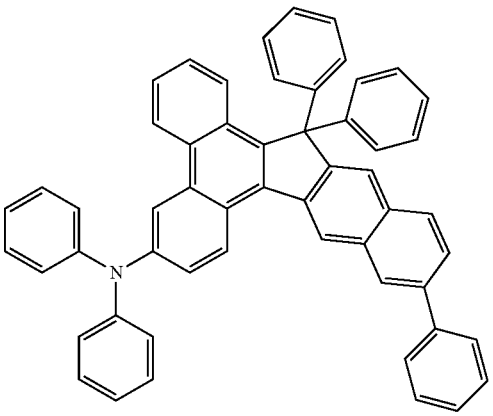

BD3

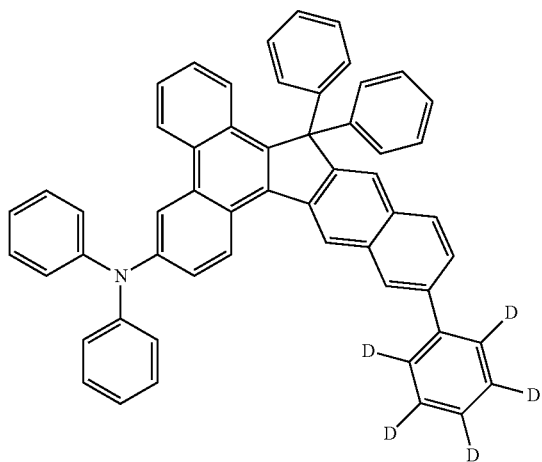

BD4

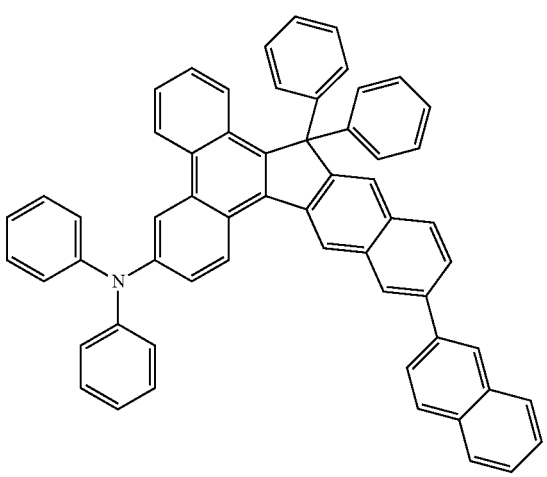

BD5

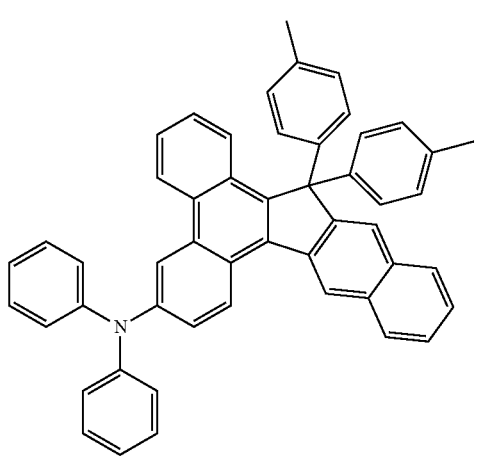

BD6

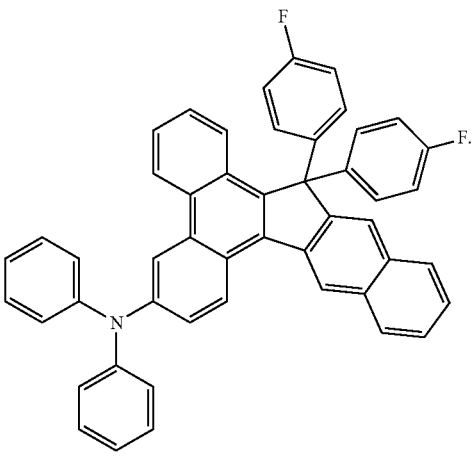

The second compound may be represented by the following Formula 3:

[Formula 3]

$$\text{A}_1\text{—L}\underset{R_3\ R_4}{\overset{R_1\ R_2}{\text{[structure]}}}\text{Het—A}_2$$

wherein, in Formula 3: $X_1$ and $X_2$ may be each independently $CR_5$ or N, $R_1$ to $R_5$ may be each independently selected from the group of hydrogen, deuterium, a substituted or unsubstituted alkyl group having 1 to 40 carbon atoms, a substituted or unsubstituted aryl group having 5 to 40 carbon atoms, a substituted or unsubstituted heteroaryl group having 5 to 40 carbon atoms, a substituted or unsubstituted aryloxy group having 5 to 40 carbon atoms, a substituted or unsubstituted alkyloxy group having 1 to 40 carbon atoms, a substituted or unsubstituted arylamino group having 5 to 40 carbon atoms, a substituted or unsubstituted diarylamino group having 5 to 40 carbon atoms, a substituted or unsubstituted arylalkyl group having 6 to 40 carbon atoms, a substituted or unsubstituted cycloalkyl group having 3 to 40 carbon atoms, and a substituted or unsubstituted heterocycloalkyl group having 3 to 40 carbon atoms; a group including a fused aliphatic ring, a group including a fused aromatic ring, a group including a fused heteroaliphatic ring, a group including a fused heteroaromatic ring, a halogen group, or a combination thereof, L may be selected from the group of a single bond, a substituted or unsubstituted arylene group having 5 to 30 carbon atoms, a substituted or unsubstituted fused arylene group having 10 to 30 carbon atoms, a substituted or unsubstituted heteroarylene group having 2 to 30 carbon atoms and including N, S, or O, a substituted or unsubstituted fused heteroarylene group having 5 to 30 carbon atoms and including N, S, or O, Het may be a substituted or unsubstituted heteroaryl group having 3 to 20 carbon atoms and including N, and $A_1$ and $A_2$ may be each independently hydrogen, a substituted or unsubstituted aryl group having 5 to 40 carbon atoms, or a substituted or unsubstituted heteroaryl group having 5 to 40 carbon atoms.

The second compound may be a compound represented by one of the following Formulae ET1 to ET18:
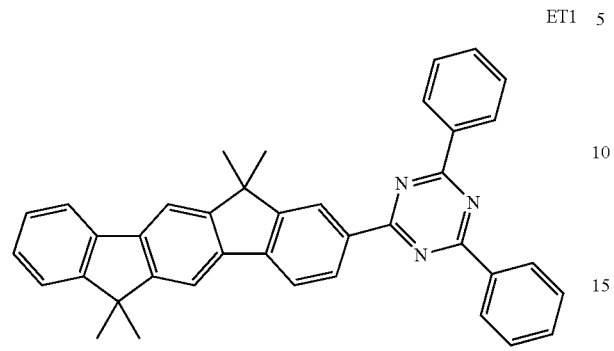
ET1
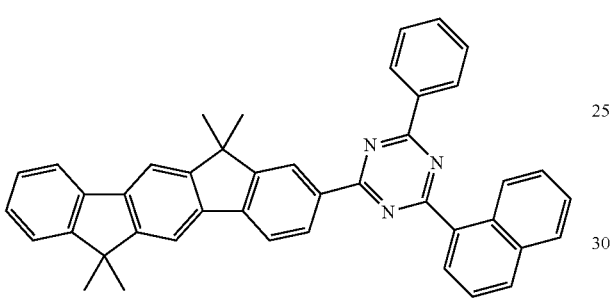
ET2
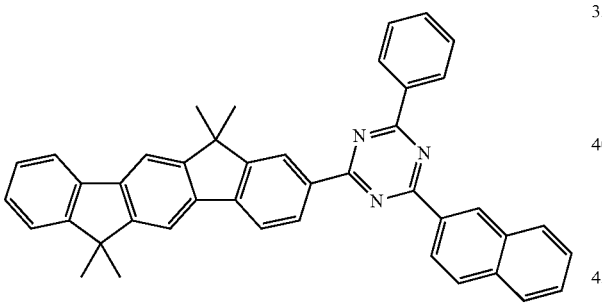
ET3
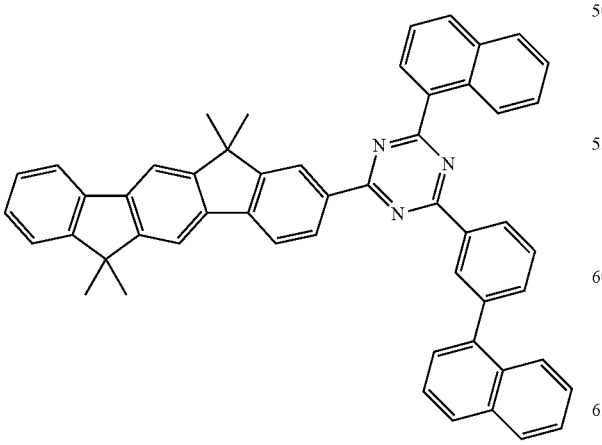
ET4
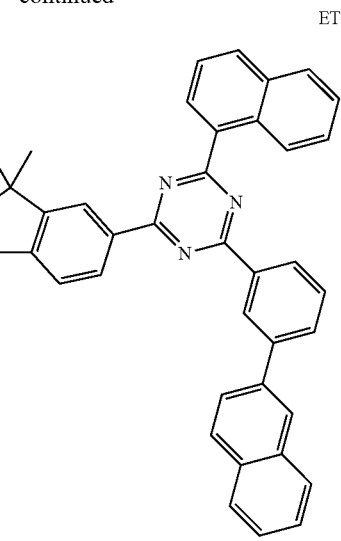
ET5
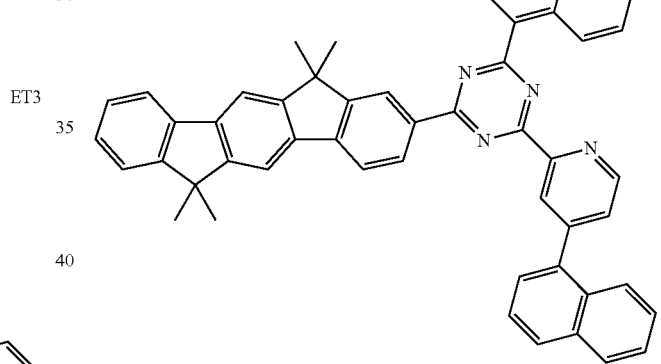
ET6
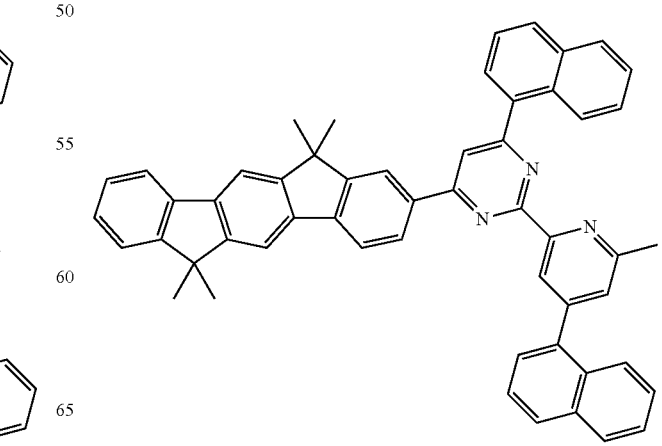
ET7

ET8
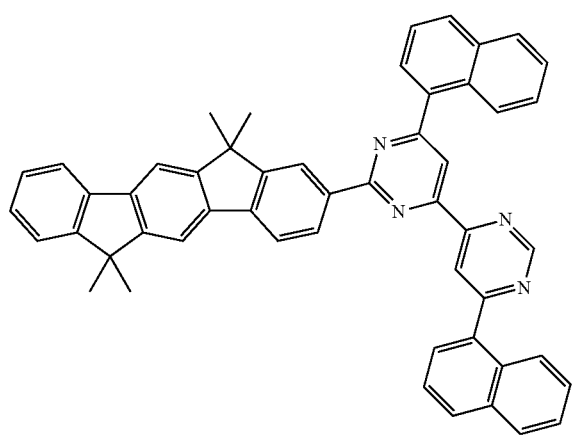
ET9
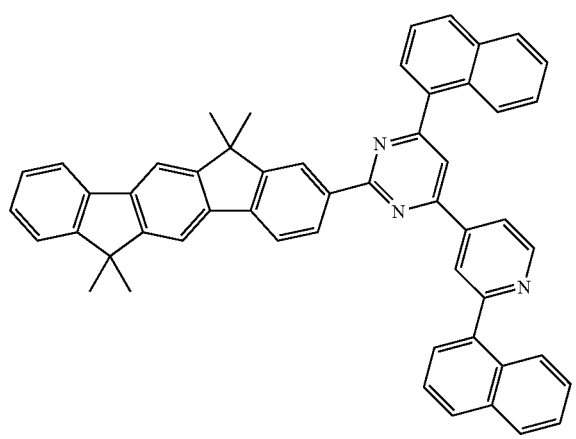
ET10
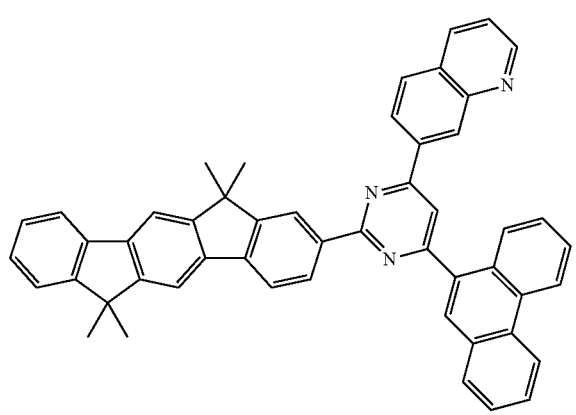
ET11
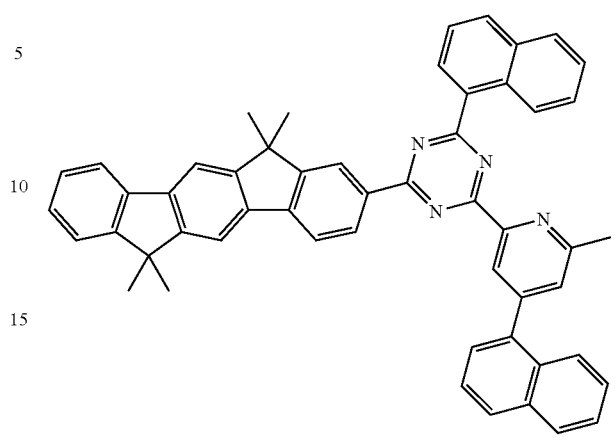
ET12
ET13
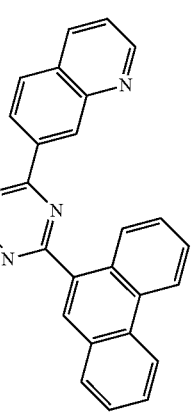

ET14

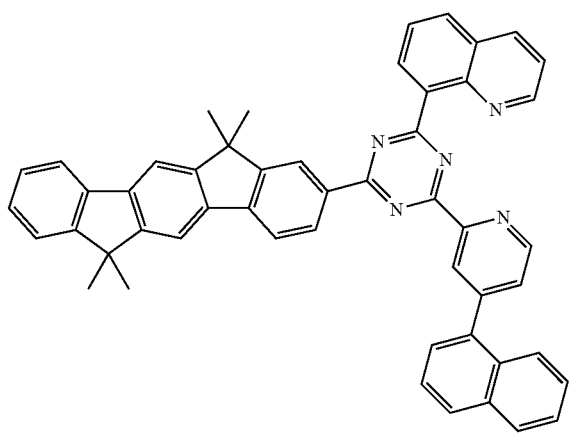

ET15

ET16

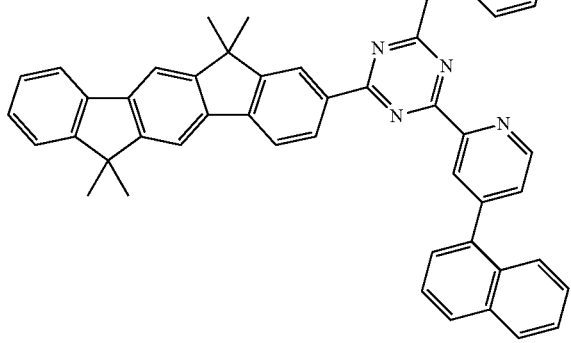

ET17

ET18

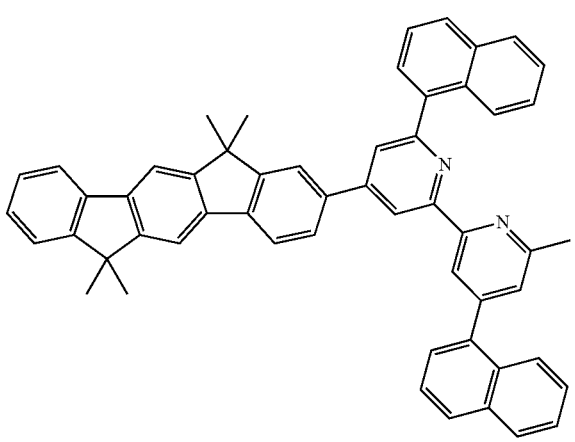

The emission layer may include a host and a blue dopant, the blue dopant including the first compound.

The host may include at least one of tris(8-quinolinorate) aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl) benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), and 2-methyl-9,10-bis(naphthalen-2-yl)anthracene (MADN).

The organic light emitting device may further include a hole transport layer between the anode and the emission layer.

The hole transport layer may include at least one of N-phenylcarbazole, polyvinylcarbazole, N,N'-bis(3-methylphenyl)-N,N'-diphenyl-[1,1-biphenyl]-4,4'-diamine (TPD), N,N'-di(1-naphthyl)-N,N'-diphenylbenzidine (NPB), 4,4', 4"-tris(N-carbazolyl)triphenylamine (TCTA), and 4,4'-cyclohexylidene bis[N,N-bis(4-methylphenyl)benzenamine (TAPC).

The organic light emitting device may further include a hole injection layer between the anode and the hole transport layer.

The hole injection layer may include at least one of N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"- tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), and polyaniline/camphor sulfonic acid (PANI/CSA), polyaniline/poly(4-styrenesulfonate) (PANI/PSS).

The organic light emitting device may further include an electron injection layer between the electron transport layer and the cathode.

The electron injection layer may include at least one of LiF, LiQ, $Li_2O$, BaO, NaCl and CsF.

The embodiments may be realized by providing a display device including a plurality of pixels, at least one of the pixels including an anode; an emission layer on the anode, the emission layer including a first compound represented by the following Formula 1; an electron transport layer on the emission layer, the electron transport layer including a second compound and the second compound including an indenofluorene derivative; and a cathode on the electron transport layer,

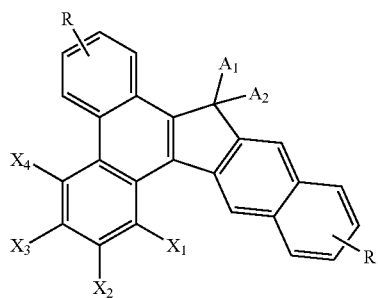

[Formula 1]

wherein, in Formula 1: $X_1$ to $X_4$ are each independently selected from the group of a substituted or unsubstituted arylamino group having 6 to 24 carbon atoms, a substituted or unsubstituted aryl group having 6 to 24 carbon atoms, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 1 to 24 carbon atoms, a substituted or unsubstituted alkoxy group having 1 to 24 carbon atoms, a cyano group, a halogen group, a substituted or unsubstituted aryloxy group having 6 to 24 carbon atoms, a substituted or unsubstituted alkylsilyl group having 1 to 24 carbon atoms, a substituted or unsubstituted arylsilyl group having 6 to 24 carbon atoms, deuterium, and hydrogen, and R, $A_1$, and $A_2$ are each independently selected from the group of hydrogen, a substituted or unsubstituted aryl group having 6 to 24 carbon atoms, a substituted or unsubstituted heteroaryl group having 1 to 24 carbon atoms, and a substituted or unsubstituted cycloalkyl group having 3 to 24 carbon atoms.

In the case that any of $X_1$ to $X_4$, R, $A_1$, and $A_2$ in the first compound are substituted, $X_1$ to $X_4$, R, $A_1$, and $A_2$ may be independently selected from the group of an aryl group having 6 to 24 carbon atoms, a heteroaryl group having 2 to 24 carbon atoms, an alkyl group having 1 to 24 carbon atoms, a heteroalkyl group having 1 to 24 carbon atoms, a cycloalkyl group having 3 to 24 carbon atoms, an alkoxy group having 1 to 24 carbon atoms, a cyano group, a halogen group, an aryloxy group having 6 to 24 carbon atoms, an alkylsilyl group having 1 to 24 carbon atoms, an arylsilyl group having 6 to 24 carbon atoms, deuterium, and hydrogen.

The first compound may be a compound represented by one of the following Formulae BD1 to BD6:

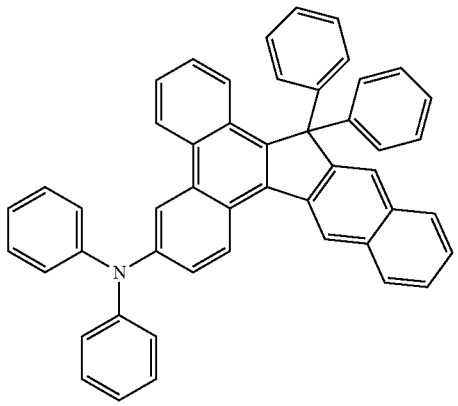

BD1

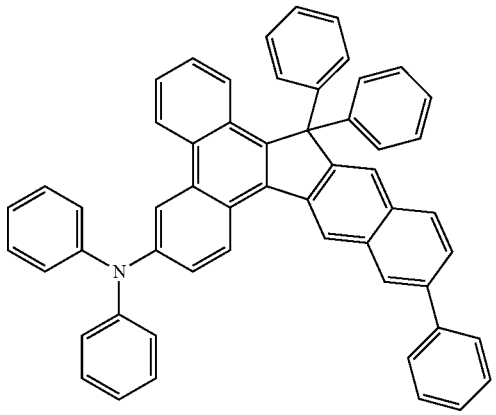

BD2

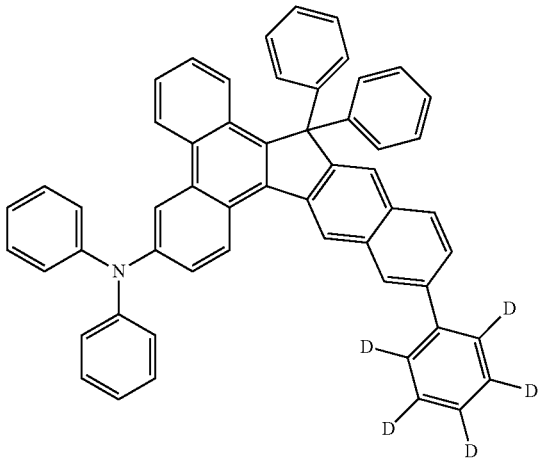

BD3

-continued

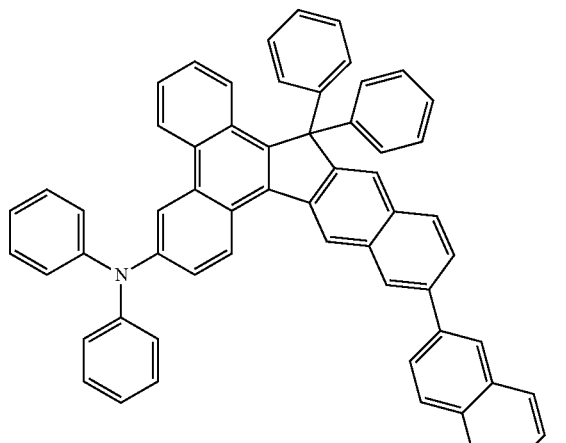
BD4

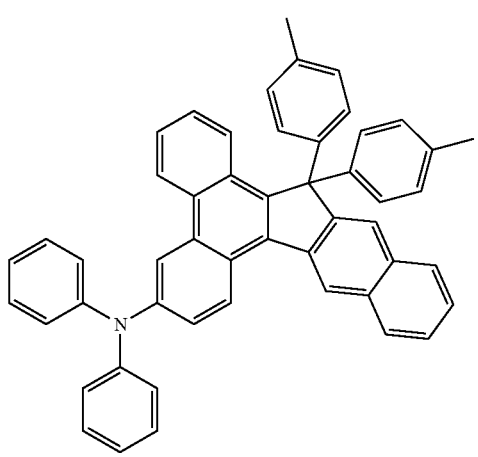
BD5

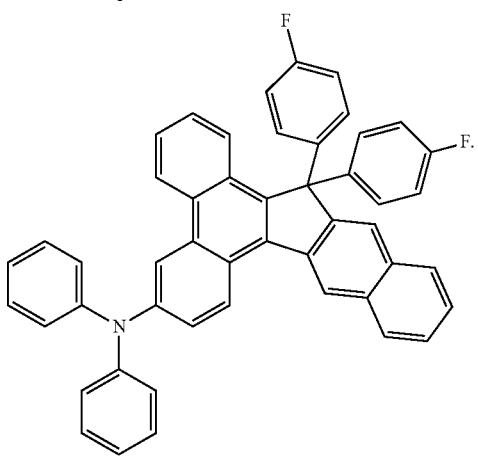
BD6

The second compound may be represented by the following Formula 3:

[Formula 3]

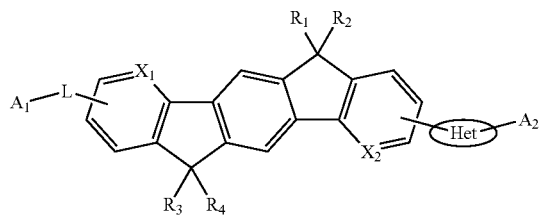

wherein, in Formula 3: $X_1$ and $X_2$ may be each independently $CR_5$ or N, $R_1$ to $R_5$ may be each independently selected from the group of hydrogen, deuterium, a substituted or unsubstituted alkyl group having 1 to 40 carbon atoms, a substituted or unsubstituted aryl group having 5 to 40 carbon atoms, a substituted or unsubstituted heteroaryl group having 5 to 40 carbon atoms, a substituted or unsubstituted aryloxy group having 5 to 40 carbon atoms, a substituted or unsubstituted alkyloxy group having 1 to 40 carbon atoms, a substituted or unsubstituted arylamino group having 5 to 40 carbon atoms, a substituted or unsubstituted diarylamino group having 5 to 40 carbon atoms, a substituted or unsubstituted arylalkyl group having 6 to 40 carbon atoms, a substituted or unsubstituted cycloalkyl group having 3 to 40 carbon atoms, and a substituted or unsubstituted heterocycloalkyl group having 3 to 40 carbon atoms; a group including a fused aliphatic ring, a group including a fused aromatic ring, a group including a fused heteroaliphatic ring, a group including a fused heteroaromatic ring, a halogen group or a combination thereof, L may be selected from the group of a single bond, a substituted or unsubstituted aryl group having 5 to 30 carbon atoms, a substituted or unsubstituted fused aryl group having 10 to 30 carbon atoms, a substituted or unsubstituted heteroaryl group having 2 to 30 carbon atoms and including N, S, or O, a substituted or unsubstituted fused heteroarylene group having 5 to 30 carbon atoms and including N, S, or O, Het may be a substituted or unsubstituted heteroaryl group having 3 to 20 carbon atoms and including N, and $A_1$ and $A_2$ may be each independently hydrogen, a substituted or unsubstituted aryl group having 5 to 40 carbon atoms, or a substituted or unsubstituted heteroaryl group having 5 to 40 carbon atoms.

The second compound may be a compound represented by one of the following Formulae ET1 to ET18:

ET1

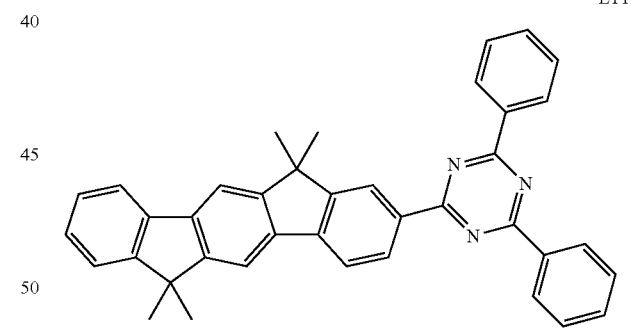

ET2

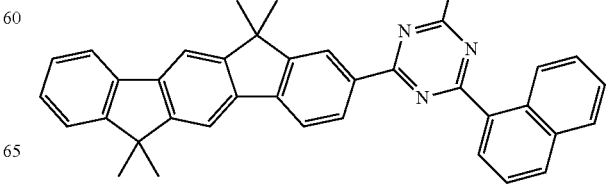

ET3
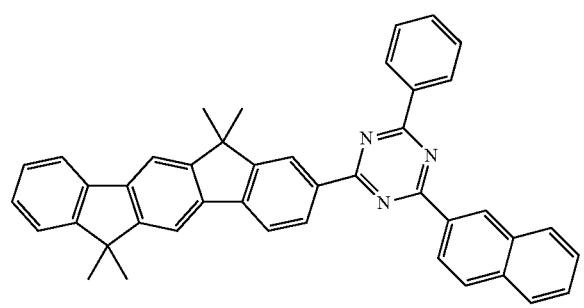
ET4
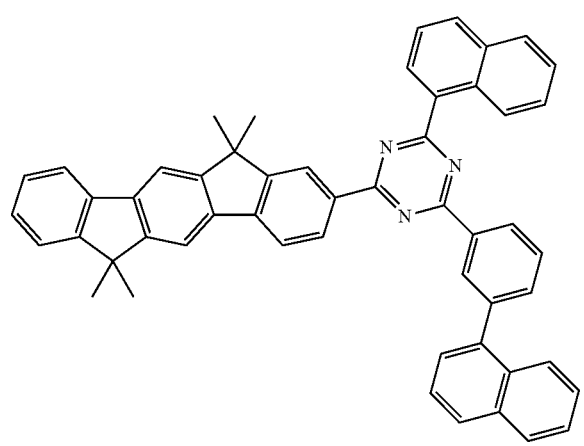
ET5
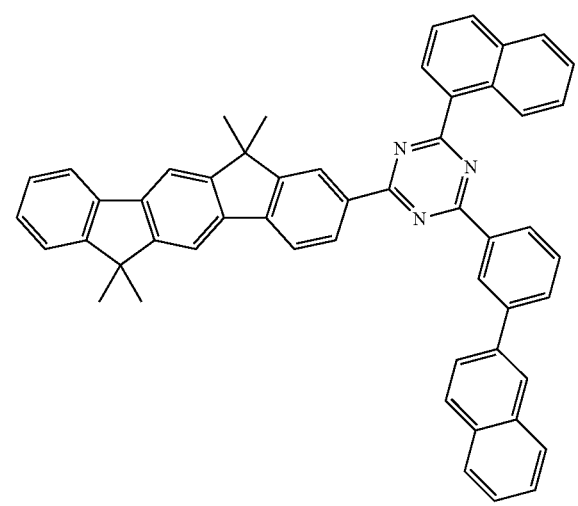
ET6
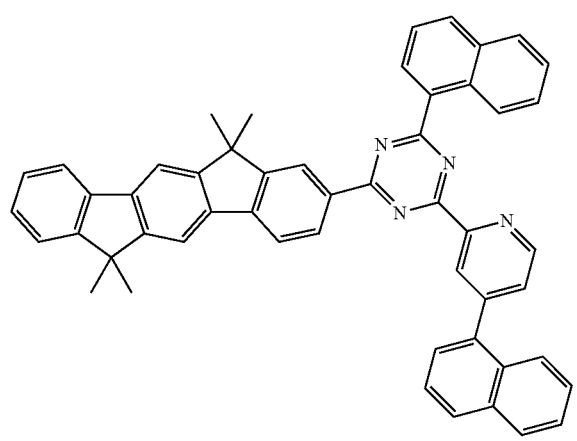
ET7
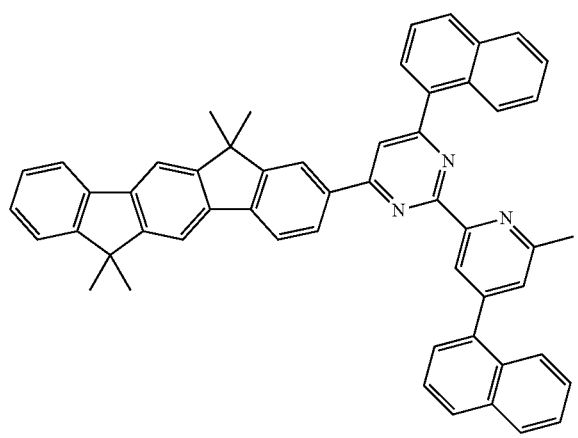
ET8
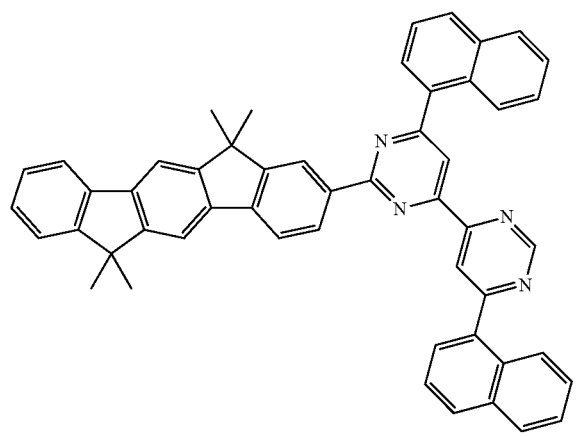

ET9
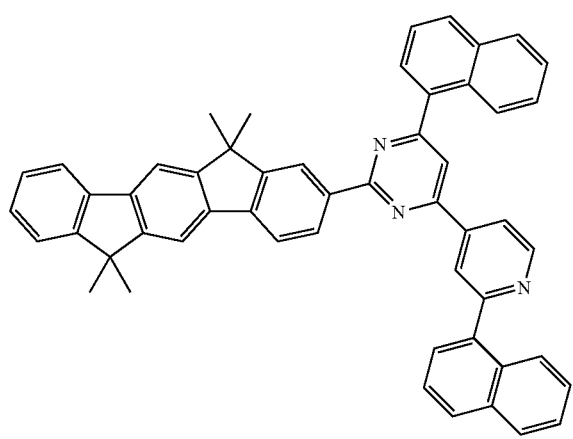
ET10
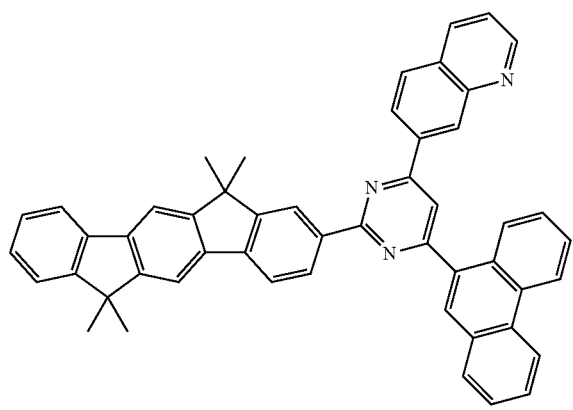
ET11
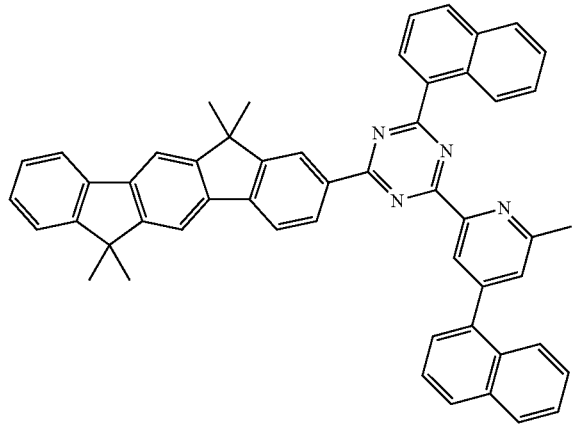
ET12
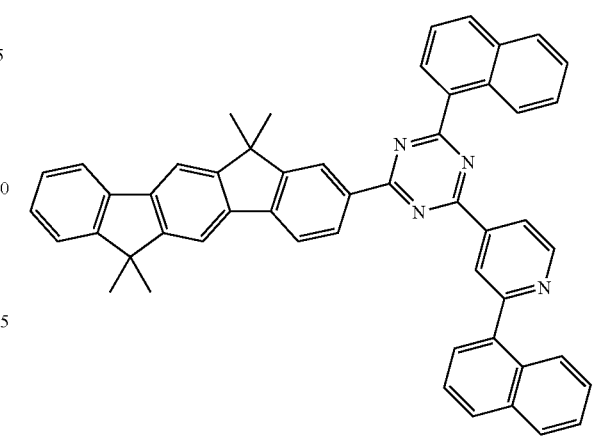
ET13
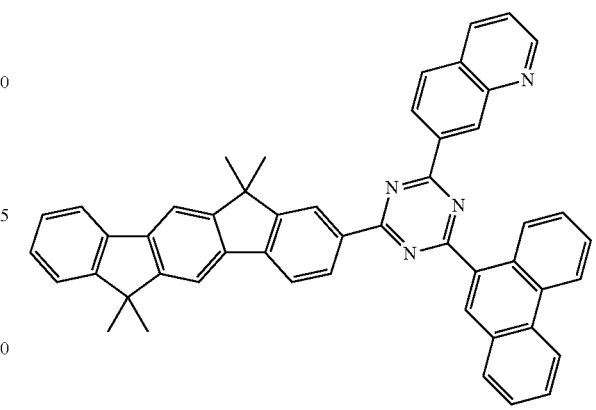
ET14
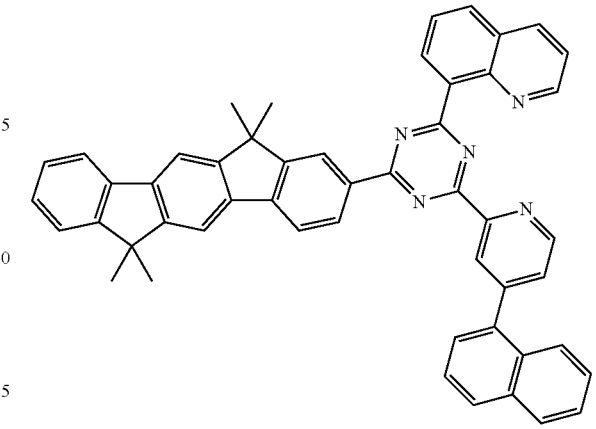

-continued

ET15
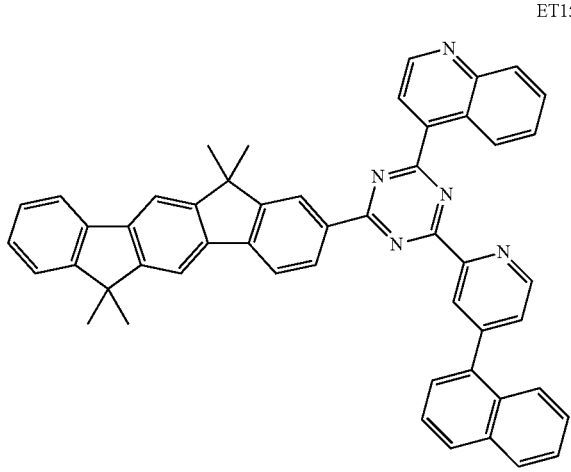

ET16

ET17

-continued

ET18
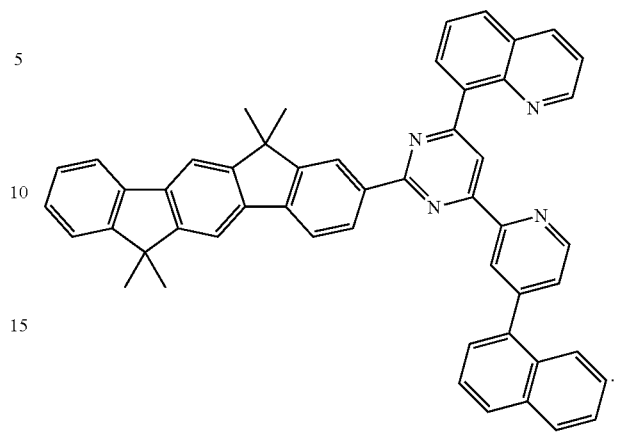

The emission layer may include a red dopant in another one of the pixels, and the emission layer may include a green dopant in still another one of the pixels.

The red dopant may include at least one of Pt(II) octaethylporphine (PtOEP), tris(2-phenylisoquinoline)iridium (Ir(piq)$_3$, and bis(2-(2'-benzothienyl)-pyridinato-N,C3') iridium(acetylacetonate) (Btp$_2$Ir(acac)), and the green dopant may include at least one of tris(2-phenylpyridine)iridium (Ir(ppy)$_3$, bis(2-phenylpyridine(acetylacetonato)iridium(III) (Ir(ppy)$_2$(acac)), tris(2-(4-tolyl)phenylpyridine)iridium (Ir(mppy)$_3$, and 10-(2-benzothiazolyl)-1,1,7,7-tetramethyl-2,3,6,7-tetrahydro-1H,5H,11H-[1]benzopyrano[6,7,8-ij]-qunolizin-11-one (C545T).

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
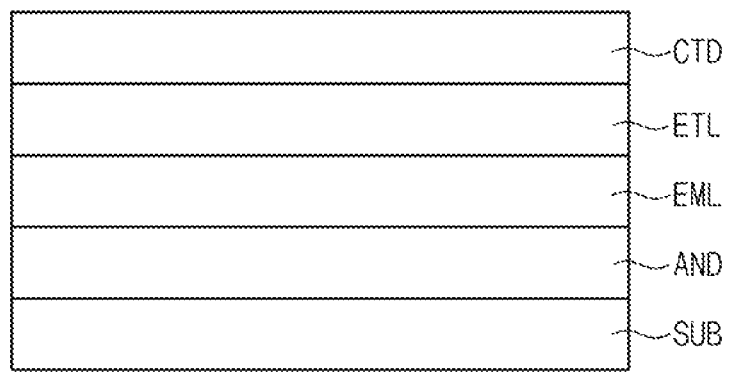
FIG. 1 illustrates a schematic cross-sectional view of an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another element. Thus, a first element discussed below could be termed a second element, and a second element could be termed as a first element. As used herein, the singular forms are intended to include the plural forms as well, unless the context clearly indicates otherwise.

It will be further understood that the terms "includes," "including," "comprises" and/or "comprising," when used in this specification, specify the presence of stated features, steps, operations, and/or devices, but do not preclude the presence or addition of one or more other features, steps, operations, and/or devices thereof. It will be also understood that when a layer, film, area, plate, etc. is referred to as being 'on' another layer, film, area, plate, etc., it can be directly on the other part, or intervening parts may be also present. Further, it will be understood that when a layer, film, area, plate, etc. is referred to as being 'under' another layer, film, area, plate, etc., it can be directly under, and one or more intervening parts may be also present.

FIG. 1 illustrates a schematic cross-sectional view of an organic light emitting device according to an embodiment.

Referring to FIG. 1, an organic light emitting device according to an may include a substrate SUB, an anode AND on the substrate SUB, an emission layer EML on the anode AND, an electron transport layer ETL on the emission layer EML, and a cathode CTD on the electron transport layer ETL.

The substrate SUB may be an insulating substrate manufactured by using glass, crystal, an organic polymer, or the like. As an organic polymer forming the substrate SUB, polyethylene terephthalate (PET), polyethylene naphthalate (PEN), polyimide, polyethersulfone, or the like may be used. The material for the substrate SUB may be selected in consideration of mechanical strength, thermal stability, transparency, surface smoothness, availability of handling, water resistance, or the like.

The anode AND may be provided on the substrate SUB and may have conductivity.

The anode AND may be formed by using a transparent metal oxide, e.g., indium tin oxide (ITO), indium zinc oxide (IZO), zinc oxide (ZnO), indium tin zinc oxide (ITZO), or the like, and may be formed by a deposition method, etc. before forming a hole injection part.

The emission layer EML may include at least one emitting material. In an implementation, the emitting material may include both a host and a dopant.

In an implementation, the host may include, e.g., tris(8-quinolinorate)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), or the like.

In an implementation, the dopant may include a first compound represented by the following Formula 1.

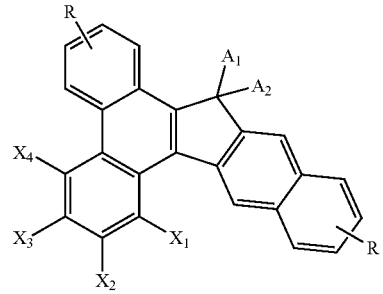

[Formula 1]

In Formula 1, $X_1$ to $X_4$ may each independently be selected from the group of a substituted or unsubstituted arylamino group having 6 to 24 carbon atoms, a substituted or unsubstituted aryl group having 6 to 24 carbon atoms, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 1 to 24 carbon atoms, a substituted or unsubstituted alkoxy group having 1 to 24 carbon atoms, a cyano group, a halogen group, a substituted or unsubstituted aryloxy group having 6 to 24 carbon atoms, a substituted or unsubstituted alkylsilyl group having 1 to 24 carbon atoms, a substituted or unsubstituted arylsilyl group having 6 to 24 carbon atoms, deuterium, and hydrogen, and R, $A_1$, and $A_2$ may each independently be selected from the group of, e.g., hydrogen, a substituted or unsubstituted aryl group having 6 to 24 carbon atoms, a substituted or unsubstituted heteroaryl group having 1 to 24 carbon atoms, and a substituted or unsubstituted cycloalkyl group having 3 to 24 carbon atoms.

In the case that any of $X_1$ to $X_4$, R, $A_1$, and $A_2$ are substituted in the first compound, $X_1$ to $X_4$, R, $A_1$, or $A_2$ may each independently be selected from the group of an aryl group having 6 to 24 carbon atoms, a heteroaryl group having 2 to 24 carbon atoms, an alkyl group having 1 to 24 carbon atoms, a heteroalkyl group having 1 to 24 carbon atoms, a cycloalkyl group having 3 to 24 carbon atoms, an alkoxy group having 1 to 24 carbon atoms, a cyano group, a halogen group, an aryloxy group having 6 to 24 carbon atoms, an alkylsilyl group having 1 to 24 carbon atoms, an arylsilyl group having 6 to 24 carbon atoms, deuterium, and hydrogen. The substituents may be combined with each other to from a saturated or unsaturated ring, may be attached to each other as a pendant method, or may be fused. In an implementation, in the case that any of $X_1$ to $X_4$, R, $A_1$, and $A_2$ are substituted in the first compound, $X_1$ to $X_4$, R, $A_1$, or $A_2$ may each independently be substituted with one of an aryl group having 6 to 24 carbon atoms, a heteroaryl group having 2 to 24 carbon atoms, an alkyl group having 1 to 24 carbon atoms, a heteroalkyl group having 1 to 24 carbon atoms, a cycloalkyl group having 3 to 24 carbon atoms, an alkoxy group having 1 to 24 carbon atoms, a cyano group, a halogen group, an aryloxy group having 6 to 24 carbon atoms, an alkylsilyl group having 1 to 24 carbon atoms, an arylsilyl group having 6 to 24 carbon atoms, or deuterium.

In an implementation, the first compound may a compound represented by one of the following Formulae BD1 to BD6.

BD1
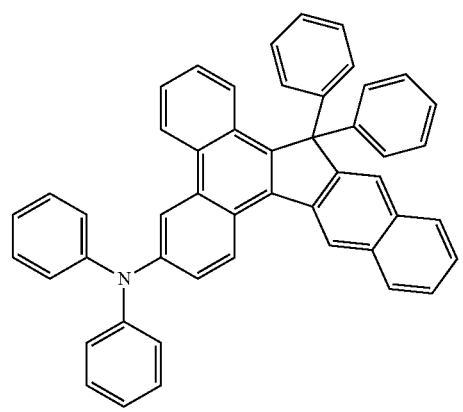

BD2
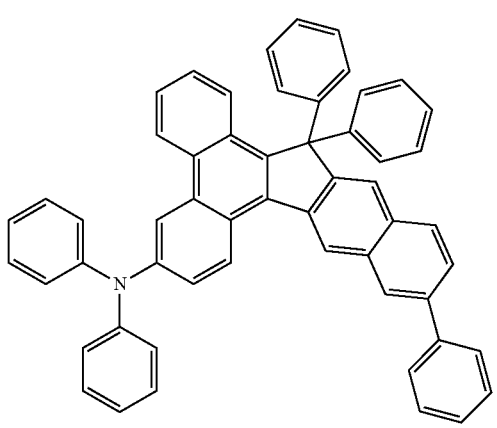

BD3
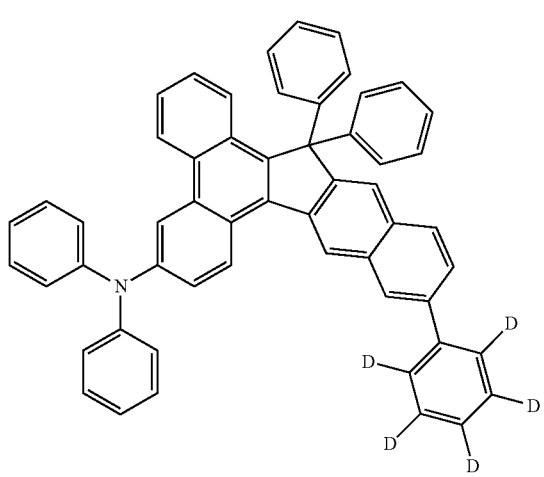

BD4
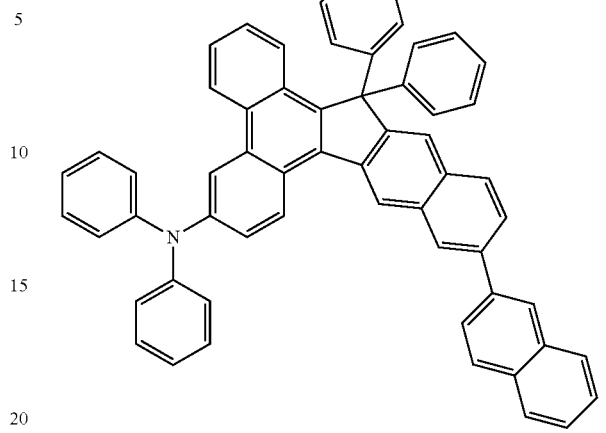

BD5
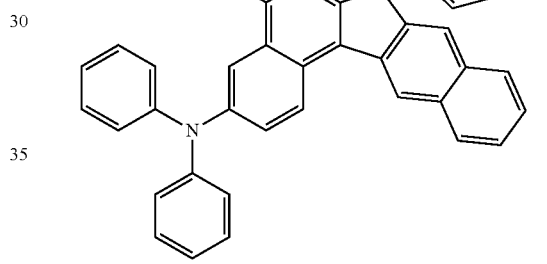

BD6
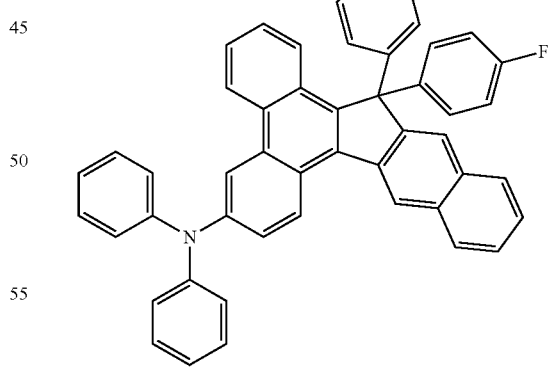

In an implementation, the dopant may be included in the emission layer in an amount of about 0.01 to about 15 parts by weight, based on 100 parts by weight of the host.

In an implementation, a thickness of the emission layer EML may be about 100 Å to about 1,000 Å, e.g., about 200 Å to about 600 Å. The thickness of the emission layer EML may be determined according to the kind of materials or the structure of a device.

In an implementation, the emission layer EML may be formed by using a method such as a vacuum deposition method, a spin coating method, a cast method, a Langmuir-Blodgett (LB) method, or the like.

In an implementation, the electron transport layer ETL may include a second compound represented by the following Formula 3.

[Formula 3]

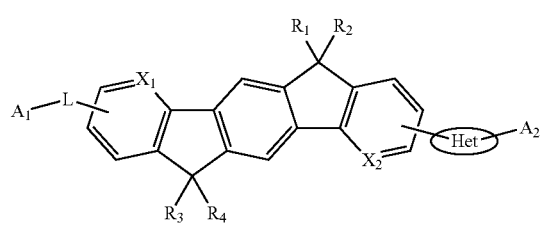

In Formula 3:

$X_1$ and $X_2$ may each independently be $CR_5$ or N, $R_1$ to $R_5$ may each independently be selected from the group of hydrogen, deuterium, a substituted or unsubstituted alkyl group having 1 to 40 carbon atoms, a substituted or unsubstituted aryl group having 5 to 40 carbon atoms, a substituted or unsubstituted heteroaryl group having 5 to 40 carbon atoms, a substituted or unsubstituted aryloxy group having 5 to 40 carbon atoms, a substituted or unsubstituted alkyloxy group having 1 to 40 carbon atoms, a substituted or unsubstituted arylamino group having 5 to 40 carbon atoms, a substituted or unsubstituted diarylamino group having 5 to 40 carbon atoms, a substituted or unsubstituted arylalkyl group having 6 to 40 carbon atoms, a substituted or unsubstituted cycloalkyl group having 3 to 40 carbon atoms, and a substituted or unsubstituted heterocycloalkyl group having 3 to 40 carbon atoms; a group including a fused aliphatic ring, a group including a fused aromatic ring, a group including a fused heteroaliphatic ring, a group including a fused heteroaromatic ring, a halogen group, or a combination thereof, L may be selected from the group of a single bond, a substituted or unsubstituted arylene group having 5 to 30 carbon atoms, a substituted or unsubstituted fused arylene group having 10 to 30 carbon atoms, a substituted or unsubstituted heteroarylene group having 2 to 30 carbon atoms and including N, S, or O, a substituted or unsubstituted fused heteroarylene group having 5 to 30 carbon atoms and including N, S, or O, Het may be a substituted or unsubstituted heteroaryl group having 3 to 20 carbon atoms and including N, and $A_1$ and $A_2$ may each independently be hydrogen, a substituted or unsubstituted aryl group having 5 to 40 carbon atoms, or a substituted or unsubstituted heteroaryl group having 5 to 40 carbon atoms.

In an implementation, a structure in which both sides of a skeleton are substituted symmetrically, and a structure in which both sides of the skeleton are substituted asymmetrically may be used.

In an implementation, the second compound may be a compound represented by one of the following Formulae ET1 to ET18.

ET1

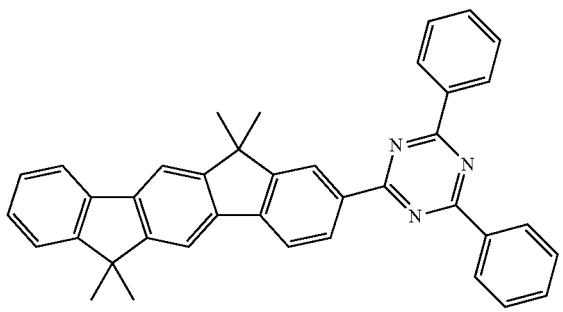

ET2

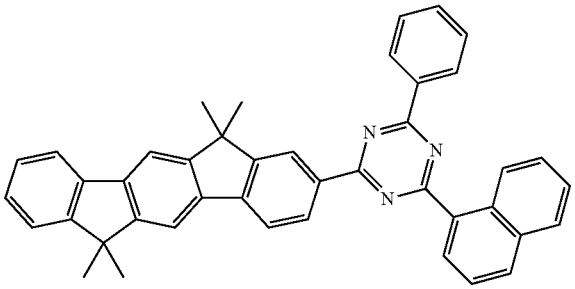

ET3

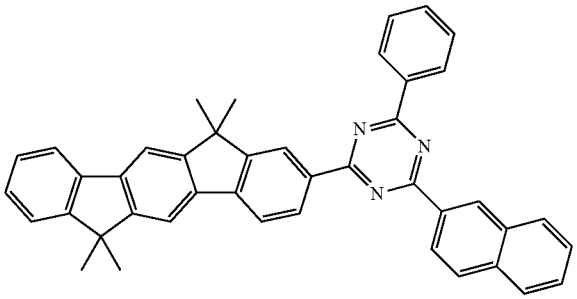

ET4

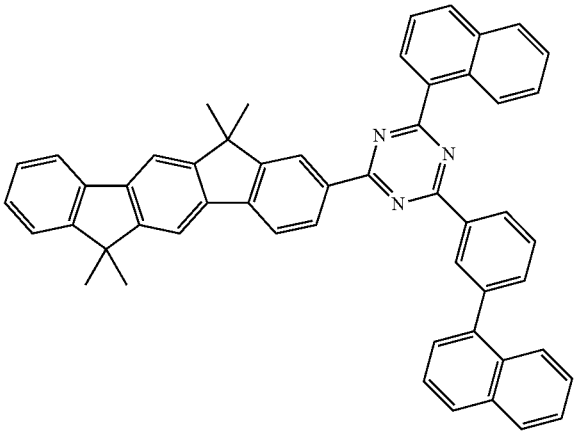

ET5
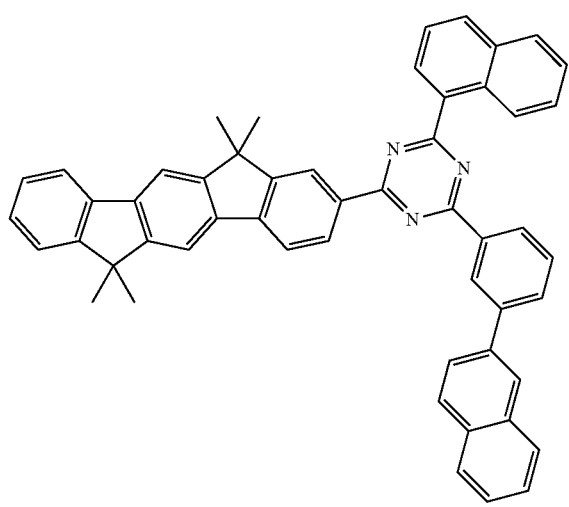
ET8
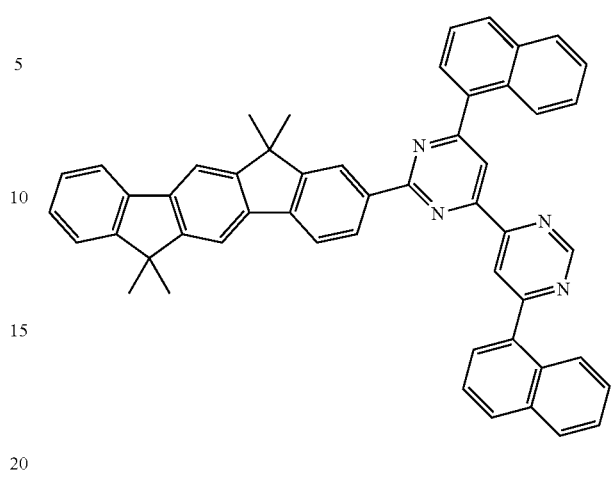
ET6
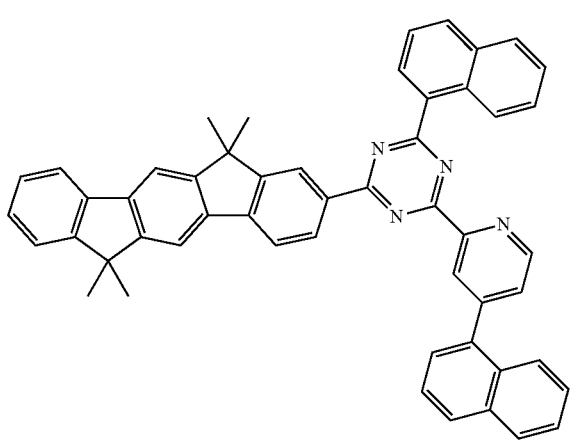
ET9
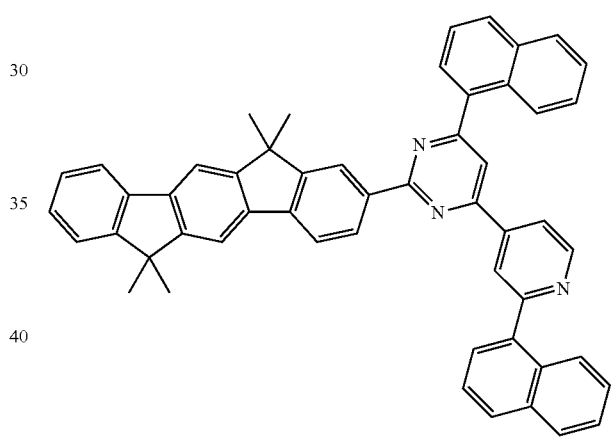
ET7
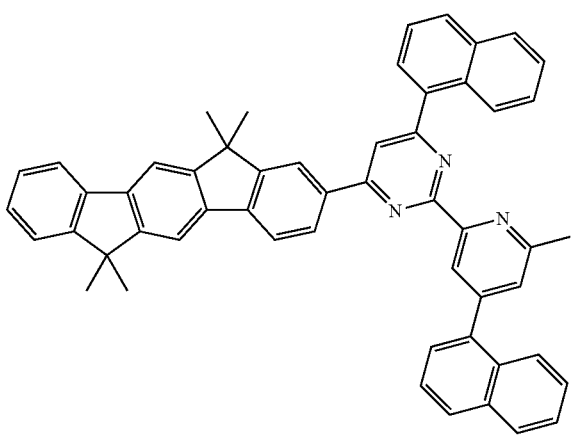
ET10
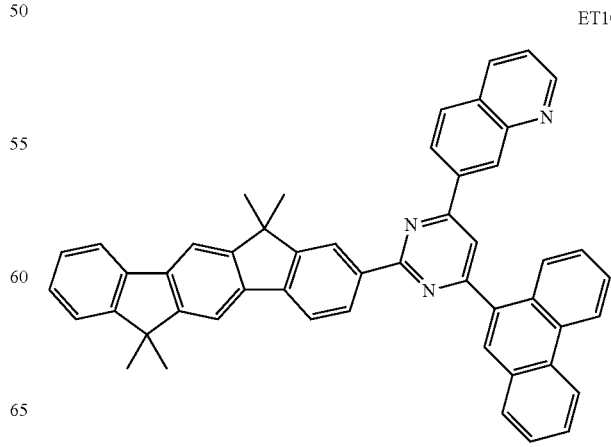

ET11
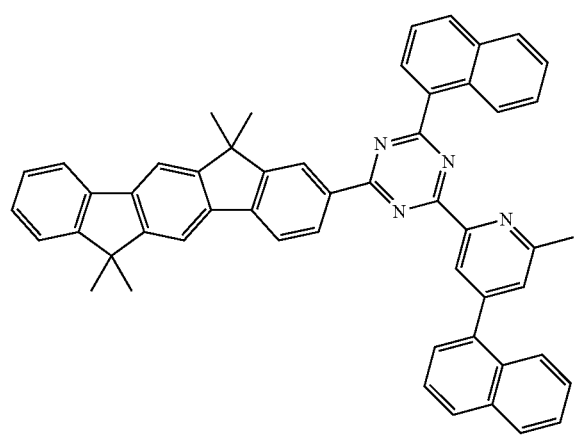
ET14
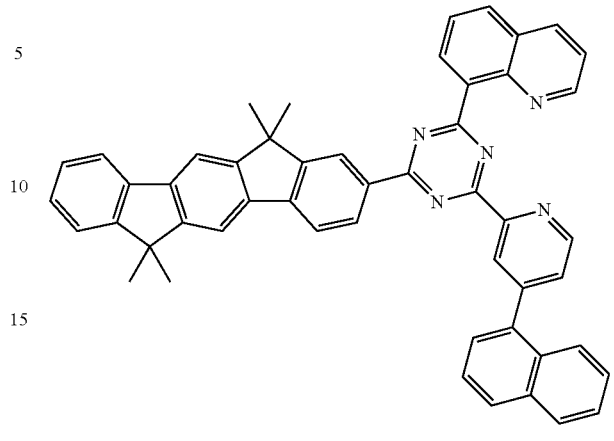
ET12
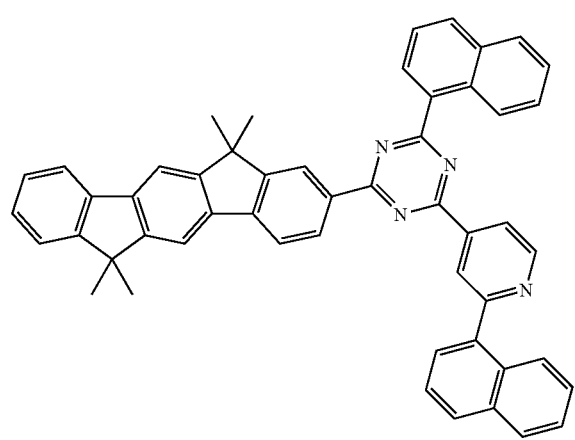
ET15
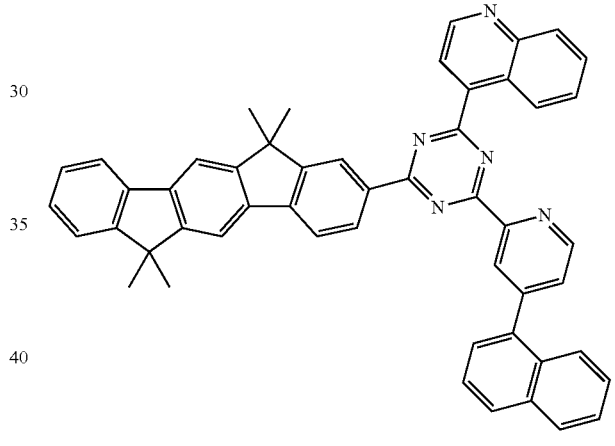
ET13
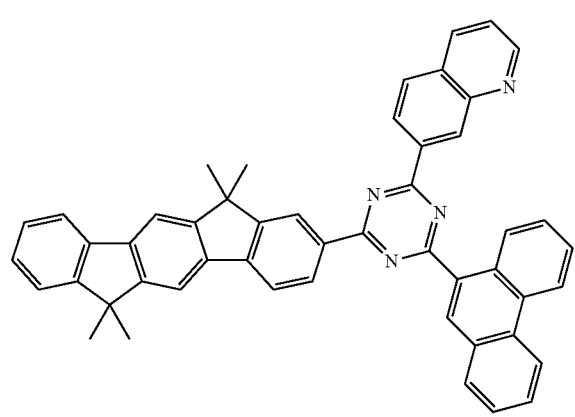
ET16
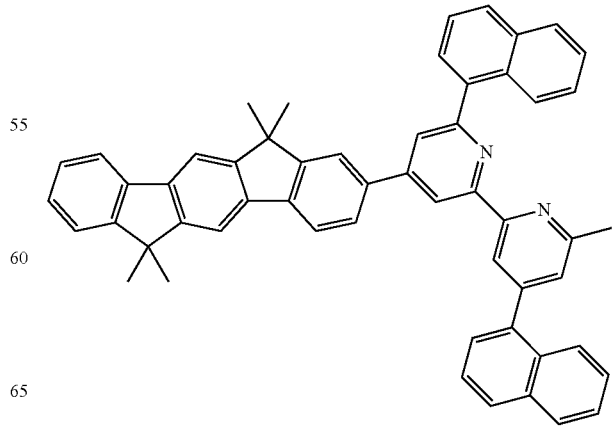

-continued

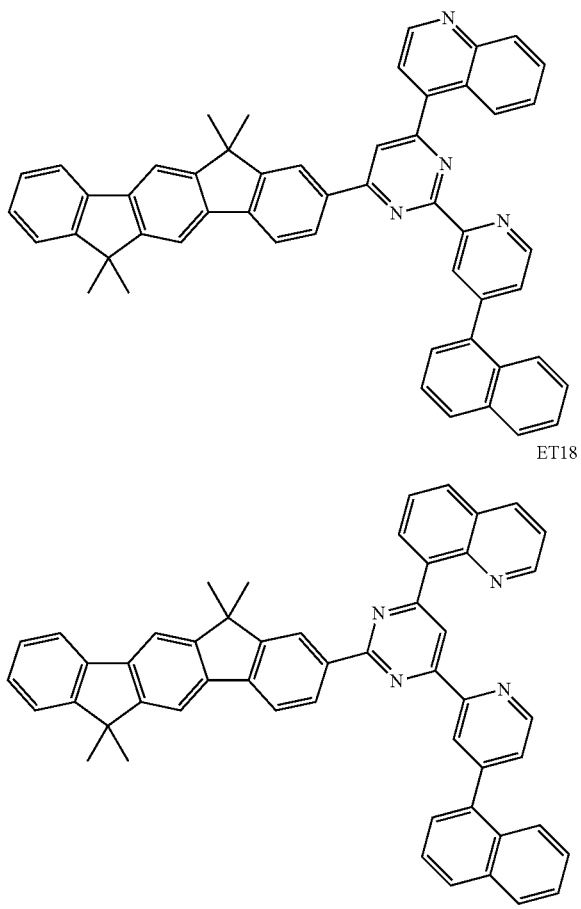

ET17

ET18

The cathode CTD may be formed by using a metal or an alloy having low work function, an electrically conductive compound, or a mixture thereof. For example, the cathode CTD may be formed by using lithium (Li), magnesium (Mg), aluminum (Al), aluminum-lithium (Al—Li), calcium (Ca), magnesium-indium (Mg—In), magnesium-silver (Mg—Ag), etc.

In the organic light emitting device having the above-described structure, voltages may be applied to the anode AND and the cathode CTD, respectively. Holes injected from the anode AND may move to the emission layer EML, and electrons injected from the cathode CTD may move via the electron transport layer ETL to the emission layer EML. The electrons and the holes may be recombined in the emission layer EML to produce excitons. Light may be emitted through the dropping of the excitons from an excited state to a ground state.

In the organic light emitting device having the above-described structure, the injection and transport of the electrons and the holes to the emission layer EML may be conducted stably, and so emission efficiency may be increased. Thus, the organic light emitting device having the above-described structure may have improved optical performance and electrical performance. For example, a second compound, e.g., an indenofluorene derivative, may be used as or in an electron transport material in the electron transport layer, and excellent thermal stability, good efficiency, and long life may be realized. By using the first compound, e.g., an indenophenanthrene derivative, in the emission layer as dopant, color purity may be improved. In addition, by matching the second compound, e.g., the indenofluorene derivative, and the first compound, e.g., the indenophenanthrene derivative, in the electron transport layer and the emission layer, high photo efficiency, and long life may be realized. These features will be described below.

Figure 2:
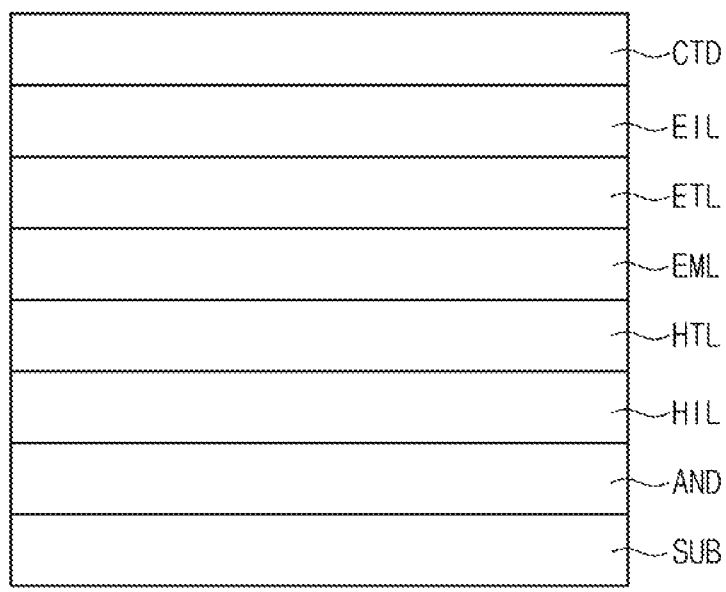
FIG. 2 illustrates a schematic cross-sectional view of an organic light emitting device according to another embodiment.

FIG. 2 illustrates a schematic cross-sectional view of an organic light emitting device according to another embodiment.

In the present embodiment, various functional layers may be added between the anode AND and the emission layer EML, and between the electron transport layer ETL and the cathode CTD. The emission layer EML, the electron transport layer ETL, the functional layer, etc. may be formed as a single layer or as a multi layer.

Referring to FIG. 2, the organic light emitting device according to the present embodiment may include a substrate SUB, and subsequently stacked layers on the substrate SUB of an anode AND, a hole injection layer HIL, a hole transport layer HTL, an emission layer EML, an electron transport layer ETL, an electron injection layer EIL, and a cathode CTD. The hole injection layer HIL, the hole transport layer HTL, and the electron injection layer EIL may be formed according to the method described herein. In an implementation, a portion thereof may be omitted. For example, only the electron transport layer ETL and the electron injection layer EIL may be provided, without the hole transport layer HTL, or only the hole transport layer HTL and the electron transport layer ETL may be provided, without the electron injection layer EIL between the emission layer EML and the cathode CTD.

The hole injection layer HIL may include, e.g., a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate (PANI/PSS), or the like.

The hole injection layer HIL may be formed by using various methods such as a vacuum deposition method, a spin coating method, a cast method, an LB method, or the like. In the case that the hole injection layer HIL is formed by the vacuum deposition method or the spin coating method, forming conditions may be dependent on the compounds used, the properties of the target hole injection layer HIL.

The thickness of the hole injection layer HIL may be about 100 Å to about 10,000 Å, e.g., about 100 Å to about 1,000 Å.

The hole transport layer HTL may include, e.g., a carbazole derivative such as N-phenylcarbazole, polyvinylcarbazole, etc., a triphenylamine derivative such as N,N'-bis(3-methylphenyl)-N,N'-diphenyl-[1,1-biphenyl]-4,4'-diamine (TPD), etc., N,N'-di(1-naphthyl)-N,N'-diphenylbenzidine (NPB), 4,4',4"-tris(N-carbazolyl)triphenylamine (TCTA), 4,4'-cyclohexylidene bis[N,N-bis(4-methylphenyl)benzenamine (TAPC), or the like.

The thickness of the hole transport layer HTL may be about 50 Å to about 1,000 Å, e.g., from about 100 Å to about 800 Å. The hole transport layer HTL may be formed by a method such as a vacuum deposition method, a spin coating method, a cast method, an LB method, etc.

In the case that the hole transport layer HTL is formed by the vacuum deposition method, the deposition conditions may be dependent on the compound used as the material of the hole transport layer HTL, and the properties of the target hole transport layer HTL. For example, suitable conditions may be selected from the deposition temperature from about 100° C. to about 500° C., the vacuum degree from about $10^{-8}$ torr to about $10^{-3}$ torr, and the deposition rate from about 0.01 Å/sec to about 100 Å/sec.

In the case that the hole transport layer HTL is formed by the spin coating method, the coating conditions may be dependent on the compound used as the material of the hole transport layer HTL, and the properties of the target hole transport layer HTL. For example, suitable conditions may be selected from the coating rate from about 2,000 rpm to about 5,000 rpm, and the heat treatment temperature for removing solvents after coating from about 80° C. to about 200° C.

The hole transport layer HTL and the hole injection layer HIL may be formed as separate layers, or may be formed as a single layer (referred to as a hole functional layer, not shown) having both functions of the hole injection and the hole transport. In this case, the hole functional layer may include at least one material of the above materials for the hole injection layer and the above materials for the hole transport layer. In this case, the thickness of the hole functional layer may be about 500 Å to about 10,000 Å, e.g., about 100 Å to about 1,000 Å.

The hole injection layer HIL, the hole transport layer HTL, or the hole functional layer may further include a charge-producing material to help improve the conductivity of the layer, etc. other than the hole injection material and the hole transport material. The charge-producing material may be, e.g., p-dopant. Examples of the p-dopant may include a quinone derivative such as tetracyanoquinodimethane (TCNQ) and 2,3,5,6-tetrafluoro-tetracyano-1,4-benzoquinonedimethane (F4TCNQ), a metal oxide such as tungsten oxide and molybdenum oxide, a cyano group containing compound, and the like.

In the case that the hole injection layer HIL, the hole transport layer HTL, or the hole functional layer further includes the charge-producing material, the charge-producing material may be homogeneously dispersed, unhomogeneously dispersed, or dispersed with concentration gradient in the layers.

The electron transport layer ETL may include a material such as tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), or the like.

The thickness of the electron transport layer ETL may be about 200 Å to about 400 Å, e.g., about 250 Å to about 350 Å.

The electron transport layer ETL may be formed by a vacuum deposition method, a spin coating method, a cast method, or an LB method. In an implementation, in the case that the electron transport layer ETL is formed by the vacuum deposition method and the spin coating method, deposition conditions and coating conditions may be dependent on the compounds used, and the electron transport layer ETL may be formed by conducting substantially the same method as that of the hole transport layer HTL.

The electron injection layer EIL may be provided on the surface of the electron transport layer ETL and may be formed by using a metal-containing material. The metal-containing material may include, e.g., LiF, lithium quinolate (LiQ), $Li_2O$, BaO, NaCl, CsF, or the like. The electron injection layer EIL may be formed on the surface of the electron transport layer ETL by vacuum thermal depositing or spin coating an electron injection material by means of a common method.

The electron injection layer EIL may be also formed by using a mixed material of an electron transport material and an insulating organo metal salt. The organo metal salt may be a material having an energy band gap of at least about 4 eV. In an implementation, the organo metal salt may include, e.g., a metal acetate, a metal benzoate, a metal acetoacetate, a metal acetylacetonate, or a metal stearate.

In an implementation electron transport layer and the electron injection layer may be provided as separate layers. In an implementation, the electron transport layer and the electron injection layer may be manufactured as a single layer (referred to as an electron functional layer, not shown) conducting both functions of electron transport and electron injection. In this case, the electron functional layer may include at least one material of the above materials for the electron injection layer and the above materials for the electron transport layer.

In the organic light emitting device having the above-described structure, the injection and transport of the electrons and the holes to the emission layer may also be performed stably as in the organic light emitting device described above. Thus, the emission efficiency is also increased.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

In the following Table 1, emission efficiency and life of organic light emitting devices according to Comparative examples and organic light emitting devices according to Examples are illustrated. In the following Table 1, T90 means the time required for exhibiting 90% of luminance with respect to 100% of luminance exhibited in an initial emission.

TABLE 1

| | Blue dopant | Material of electron transport layer | λ max (nm) | Efficiency (cd/A) | Life (T90; hr) |
|---|---|---|---|---|---|
| Example 1 | BD1 | ET1 | 442 | 6.3 | 141 |
| Example 2 | BD3 | ET3 | 450 | 5.9 | 157 |
| Example 3 | BD4 | ET3 | 448 | 5.4 | 214 |
| Example 4 | BD6 | ET7 | 448 | 5.2 | 122 |
| Example 5 | BD2 | ET8 | 453 | 5.3 | 154 |
| Example 6 | BD4 | ET10 | 446 | 6.3 | 137 |
| Example 7 | BD2 | ET11 | 441 | 5.2 | 117 |
| Example 8 | BD1 | ET11 | 445 | 5.4 | 127 |
| Example 9 | BD1 | ET11 | 442 | 6.7 | 178 |
| Example 10 | BD1 | ET11 | 443 | 5.6 | 194 |

TABLE 1-continued

|  | Blue dopant | Material of electron transport layer | λ max (nm) | Efficiency (cd/A) | Life (T90; hr) |
|---|---|---|---|---|---|
| Comparative Example 1 | DNTPD | Alq3 | 460 | 3.4 | 67 |
| Comparative Example 2 | BD1 | BCP/Alq3 | 449 | 3.9 | 64 |
| Comparative Example 3 | DNTPD | ET1 | 458 | 4.2 | 93 |

In Table 1, an organic light emitting device according to Example 1 was manufactured by the following process, and organic light emitting devices according to Examples 2 to 10 were manufactured by conducting the same process as in Example 1 except for using different blue dopant and different material of the electron transport layer.

For the manufacture of an anode, an ITO glass substrate of 15 Ω/cm² (500 Å) from Corning Co. was used. The ITO glass substrate was cut into a 50 mm×50 mm×0.5 mm size, ultrasonically washed using isopropyl alcohol and pure water for 10 minutes, respectively, exposed to ultraviolet radiation for 10 minutes, and exposed to ozone for washing. After installing the substrate in a vacuum deposition apparatus, 2-TNATA was vacuum deposited on the glass substrate with the anode formed thereon to a thickness of about 600 Å to form a hole injection layer. On the hole injection layer, NPB was vacuum deposited to a thickness of about 300 Å to from a hole transport layer. Then, MADN and 5 wt % of Compound BD1 were vacuum deposited to a thickness of about 300 Å to form an emission layer. On the emission layer, the material for the electron transport layer (Compound ET1) was vacuum deposited to a thickness of about 300 Å to form an electron transport layer. On the electron transport layer, 10 Å of LiF (an electron injection layer) and 2,000 Å of Al (a cathode) were subsequently vacuum deposited to manufacture an organic light emitting device.

According to Table 1, an organic light emitting device according to Comparative Example 1 was manufactured by the following method, and the organic light emitting device according to Comparative Example 1 excluded both of the first and the second compound according to an embodiment.

An anode, a hole injection layer, a hole transport layer, an emission layer, an electron transport layer, and a cathode were manufactured by the same method in Example 1, except for using DNTPD as the blue dopant and depositing Alq3 as the electron transport layer. In this case, the emission layer was formed by vacuum depositing MADN and 5 wt % of DNTPD to a thickness of about 300 Å, and the electron transport layer was formed by vacuum depositing Alq3 to a thickness of about 400 Å.

According to Table 1, an organic light emitting device according to Comparative Example 2 was manufactured by the following method, and the organic light emitting device according to Comparative Example 2 excluded the electron transport material according to an embodiment.

An anode, a hole injection layer, a hole transport layer, an emission layer, an electron transport layer, and a cathode were manufactured by the same method in Example 1, except for using BCP and Alq3 instead of ET1 as the electron transport layer. In this case, the electron transport layer was formed by vacuum depositing BCP to a thickness of about 100 Å, and vacuum depositing Alq3 to a thickness of about 300 Å.

According to Table 1, an organic light emitting device according to Comparative Example 3 was manufactured by the following method, and the organic light emitting device according to Comparative Example 3 excluded the blue dopant according to an embodiment.

An anode, a hole injection layer, a hole transport layer, an emission layer, an electron transport layer, and a cathode were manufactured by the same method in Example 1, except for using and depositing DNTPD as the blue dopant instead of BD1. In this case, the emission layer was formed by vacuum depositing MADN and 5 wt % of DNTPD to a thickness of about 300 Å.

Referring to Table 1, the emission efficiency of the organic light emitting devices according to Examples to 10, employing the blue dopant according to an embodiment in the emission layer and the electron transport material according to an embodiment in the electron transport layer, was about 5.2 cd/A to about 6.7 cd/A, and the life thereof was about 117 to about 214 hours. The emission efficiency of the organic light emitting devices according to Comparative Examples 1 to 3, which omitted at least one of the blue dopant according to an embodiment and/or the electron transport material according to an embodiment was only about 3.4 cd/A to about 4.2 cd/A, and the life thereof was only about 64 to about 93 hours. As a result, it may be seen that the emission efficiency for, e.g., Examples 1, 2, 6 and 9, was markedly improved by, e.g., greater than or equal to 80%, and life was markedly increased by, e.g., two or more times, when compared to the emission efficiency for Comparative Examples 1 to 3.

In addition, in the case in which only one of the blue dopant according to an embodiment and/or the electron transport material according to an embodiment was included in the organic light emitting device, markedly low emission efficiency and life were obtained, when compared to the organic light emitting device including both of the blue dopant according to an embodiment and the electron transport material according to an embodiment. Thus, by matching the first compound and the second compound according to the embodiments as the emission material and the electron transport material, high efficiency and long life of the organic light emitting device may be realized.

In addition, in the emission material, in the case that the first compound was used as the blue dopant, λ max was closer to blue, when compared to a case using DNTPD as the dopant, and the realization of color having high purity may be possible.

The organic light emitting device having the above-described structure may emit blue light and may be used in various electronic devices, e.g., lighting instruments or display apparatuses.

Figure 3:
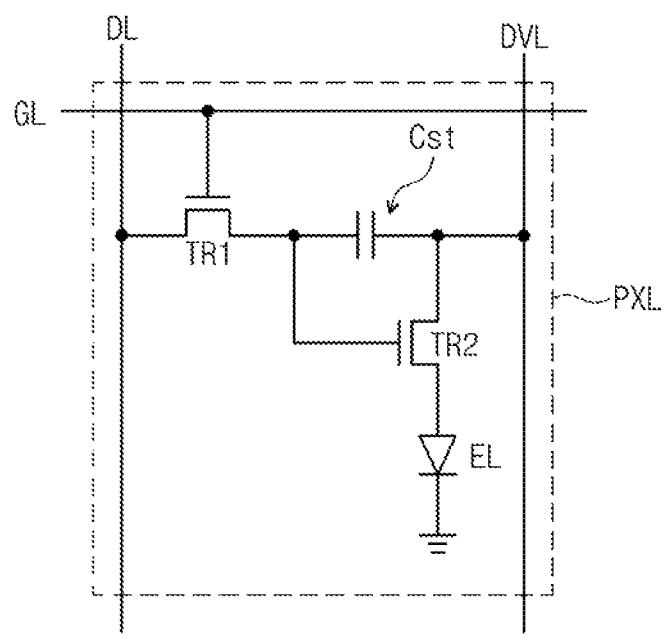
FIG. 3 illustrates a circuit diagram of a pixel when an organic light emitting device according to an embodiment is applied in a display device.
Figure 4:
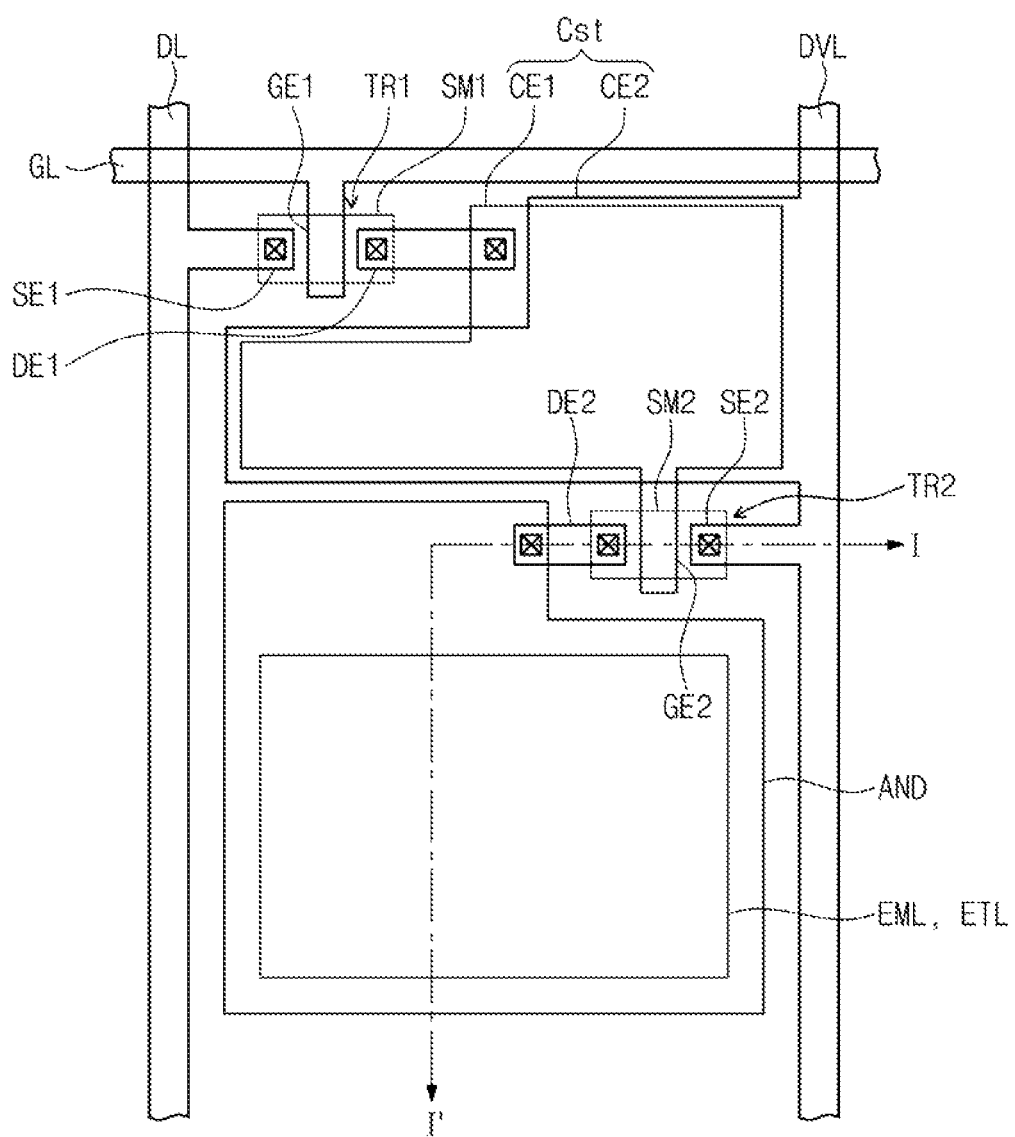
FIG. 4 illustrates a plan view of the pixel illustrated in FIG. 3.
Figure 5:
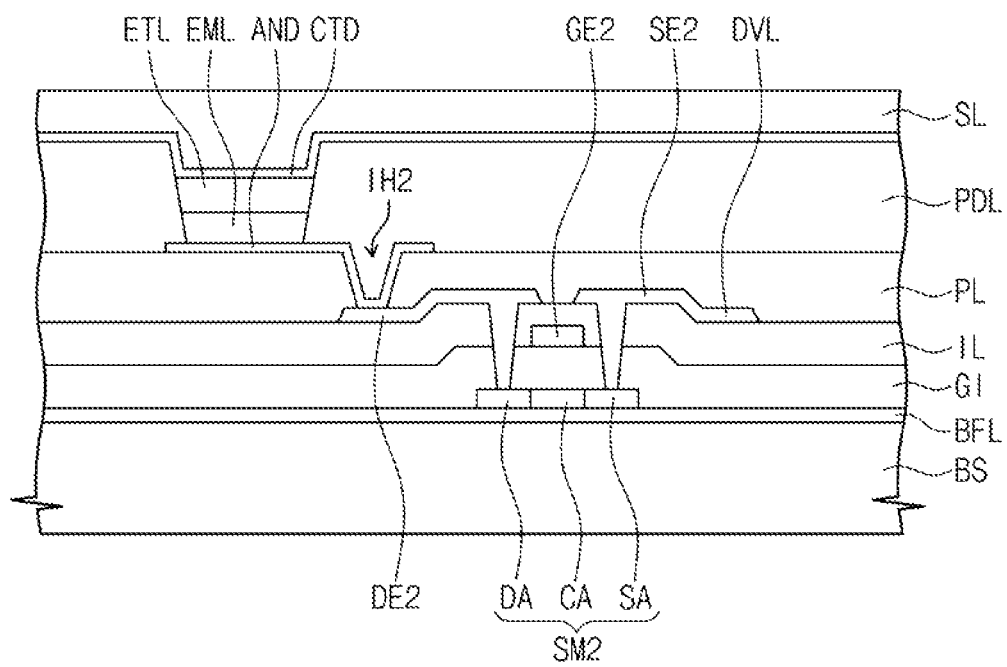
FIG. 5 illustrates a cross-sectional view cut along line I-I' in FIG. 4.

FIG. 3 illustrates a circuit diagram of a pixel when an organic light emitting device according to an embodiment is applied in a display device, FIG. 4 illustrates a plan view of the pixel illustrated in FIG. 3, and FIG. 5 illustrates a cross-sectional view cut along line I-I' in FIG. 4.

Hereinafter, a display device employing the organic light emitting device according to an embodiment will be explained referring to FIGS. 3 to 5.

A display device according to an embodiment may include at least one pixel PXL provided with or for displaying images. A plurality of the pixels PXL may be provided and arranged in a matrix shape, and each of the pixels PXL may emit light having specific color among, e.g., red light, green light, and blue light. The kind of the color light is not limited thereto and may further include, e.g., cyan light, magenta light, yellow light, etc.

In a display device according to an embodiment, at least one pixel PXL may emit blue light, and a pixel PXL emitting blue light will be explained below.

The pixel PXL may include a line part including a gate line GL, a data line DL, and a driving voltage line DVL, a thin film transistor connected to the line part, an organic light emitting device connected to the thin film transistor, and a capacitor Cst.

The gate line GL may extend in one direction. The data line DL may extend in another direction crossing the gate line GL. The driving voltage line DVL may extend in substantially the same direction as the data line DL. The gate line GL may transmit scanning signals to the thin film transistor, the data line DL may transmit data signals to the thin film transistor, and the driving voltage line DVL may provide a driving voltage to the thin film transistor.

The thin film transistor may include a driving thin film transistor TR2 for controlling the organic light emitting device, and a switching thin film transistor TR1 for switching the driving thin film transistor TR2. In an implementation, one pixel PXL may include two thin film transistors TR1 and TR2. In an implementation, one pixel PXL may be provided with one thin film transistor and one capacitor, or one pixel PXL may be provided with at least three thin film transistors and at least two capacitors.

The switching thin film transistor TR1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to the gate electrode of the driving thin film transistor TR2 (e.g., a second gate electrode GE2). The switching thin film transistor TR1 may transmit data signals applied to the data line DL according to the scanning signals applied to the gate line GL to the driving thin film transistor TR2.

The driving thin film transistor TR2 may include a second gate electrode GE2, a second source electrode SE2, and a second drain electrode DE2. The second gate electrode GE2 may be connected to the switching thin film transistor TR1, the second source electrode SE2 may be connected to the driving voltage line DVL, and the second drain electrode DE2 may be connected to the organic light emitting device.

The organic light emitting device may include an anode AND, an emission layer EML on the anode AND, an electron transport layer ETL on the emission layer EML, and a cathode CTD on the electron transport layer ETL. The anode AND may be connected to the second drain electrode DE2 of the driving thin film transistor TR2.

The emission layer EML and the electron transport layer ETL may include the above-described materials according to an embodiment. For example, the emission layer EML may include the dopant represented by the above Formula 1, and the electron transport layer ETL may include the, e.g., indenofluorene compound, represented by the above Formula 3. In an implementation, the emission layer EML may include the compound represented by one of Formulae BD1 to BD6, and the electron transport layer ETL may include the compound represented by one of Formulae ET1 to ET18.

In an implementation, the dopant represented by Formula 1 may be dopant for emitting blue light. The other pixels, e.g., other than the pixel including the dopant represented by the above Formula 1, may include a red dopant emitting red light or a green dopant emitting green light. In an implementation, the red dopant may include Pt(II) octaethylporphine (PtOEP), tris(2-phenylisoquinoline)iridium (Ir(piq)$_3$, bis(2-(2'-benzothienyl)-pyridinato-N,C3')iridium(acetylacetonate) (Btp$_2$Ir(acac)), etc. In an implementation, the green dopant may include tris(2-phenylpyridine)iridium (Ir(ppy)$_3$, bis(2-phenylpyridine(acetylacetonato)iridium(III) (Ir(ppy)$_2$(acac)), tris(2-(4-tolyl)phenylpyridine)iridium (Ir(mppy)$_3$, 10-(2-benzothiazolyl)-1,1,7,7-tetramethyl-2,3,6,7-tetrahydro-1H,5H,11H-[1]benzopyrano[6,7,8-ij]-qunolizin-11-one (C545T), etc.

The capacitor Cst may be connected between the second gate electrode GE2 and the second source electrode SE2 of the driving thin film transistor TR2, and may charge and maintain data signals inputted to the second gate electrode GE2 of the driving thin film transistor TR2.

A common voltage may be applied in the cathode CTD, and the emission layer EML may emit blue light according to the output signals of the driving thin film transistor TR2 to display images.

Hereinafter, the display device according to an embodiment will be explained according to the stacking order.

The display device according to an embodiment may include an insulating base substrate BS of glass, plastic, crystal, or the like on which a thin film transistor and an organic light emitting device may be stacked.

On the base substrate BS, a buffer layer BFL may be formed. The buffer layer BFL may help prevent diffusion of impurities into switching and driving thin film transistors TR1 and TR2. The buffer layer BFL may be formed by using, e.g., silicon nitride (SiNx), silicon oxide (SiOx), silicon oxynitride (SiOxNy), etc., or may be omitted according to the material of the base substrate BS and process conditions.

On the buffer layer BFL, a first semiconductor layer SM1 and a second semiconductor layer SM2 may be provided. The first semiconductor layer SM1 and the second semiconductor layer SM2 may be formed by using a semiconductor material, and may be operated as an active layer of a switching thin film transistor TR1 and a driving thin film transistor TR2, respectively. Each of the first semiconductor layer SM1 and the second semiconductor layer SM2 may include a source area SA, a drain area DA, and a channel area CA provided between the source area SA and the drain area DA. Each of the first semiconductor layer SM1 and the second semiconductor layer SM2 may be formed by selecting from an inorganic semiconductor or an organic semiconductor. The source area SA and the drain area DA may be doped with n-type impurities or p-type impurities.

On the first semiconductor layer SM1 and the second semiconductor layer SM2, a gate insulating layer GI may be provided.

On the gate insulating layer GI, a first gate electrode GE1 and a second gate electrode GE2 connected to the gate line GL may be provided. Each of the first gate electrode GE1 and the second gate electrode GE2 may cover an area corresponding to the channel area CA of each of the first semiconductor layer SM1 and the second semiconductor layer SM2.

On the first and second gate electrodes GE1 and GE2, an interlayer dielectric IL covering the first and the second gate electrodes GE1 and GE2 may be provided.

On the interlayer dielectric IL, a first source electrode SE1, a first drain electrode DE1, a second source electrode SE2 and a second drain electrode DE2 may be provided. The first source electrode SE1 and the first drain electrode DE1 may make contact with the source area SA and the drain area DA of the first semiconductor layer SM1, respectively, through contact holes formed in the gate insulating layer GI and the interlayer dielectric IL. The second source electrode SE2 and the second drain electrode DE2 may make contact with the source area SA and the drain area DA of the second semiconductor layer SM2, respectively, through contact holes formed in the gate insulating layer GI and the interlayer dielectric IL.

On the first source electrode SE1, the first drain electrode DE1, the second source electrode SE2 and the second drain electrode DE2, a passivation layer PL may be provided. The passivation layer PL may play the role of a passivation layer passivating the switching and driving thin film transistors TR1 and TR2 and may play the role of a planarization layer planarizing the top surface thereof.

On the passivation layer PL, an anode AND may be provided as an anode of the organic light emitting device. The anode AND may be connected to the second drain electrode DE2 of the driving thin film transistor TR2 through a contact hole formed in the passivation layer PL.

On the base substrate BS on which the anode AND, etc. are formed, a pixel defining layer PDL dividing pixel areas PA so as to correspond to each pixel may be provided. The pixel defining layer PDL may expose the top surface of the anode AND and may be extruded or may extend from the base substrate BS along the circumference of the pixel.

In the pixel area PA surrounded by the pixel defining layer PDL, an emission layer EML may be provided, an electron transporting layer ETL may be provided on the emission layer EML, and a cathode CTD may be provided on the electron transporting layer ETL.

On the cathode CTD, a sealing layer SL covering the cathode CTD may be provided.

The organic light emitting device manufactured by the above-described method may function as a display device displaying color images through the recognition of emitted blue light, red light, and green light by a user.

The embodiments may provide an organic light emitting device with high quality and having improved photo efficiency and life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
an anode;
an emission layer on the anode, the emission layer including a first compound represented by the following Formula 1;
an electron transport layer on the emission layer, the electron transport layer including a second compound and the second compound being an indenofluorene derivative; and
a cathode on the electron transport layer,

[Formula 1]

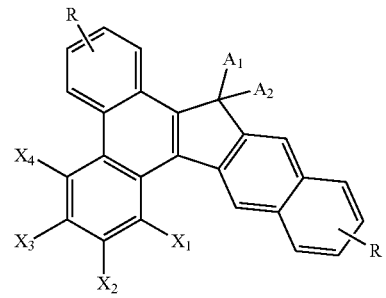

wherein, in Formula 1:
$X_1$ to $X_4$ are each independently selected from the group of a substituted or unsubstituted arylamino group having 6 to 24 carbon atoms, a substituted or unsubstituted aryl group having 6 to 24 carbon atoms, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 1 to 24 carbon atoms, a substituted or unsubstituted alkoxy group having 1 to 24 carbon atoms, a cyano group, a halogen group, a substituted or unsubstituted aryloxy group having 6 to 24 carbon atoms, a substituted or unsubstituted alkylsilyl group having 1 to 24 carbon atoms, a substituted or unsubstituted arylsilyl group having 6 to 24 carbon atoms, deuterium, and hydrogen, and
R, $A_1$, and $A_2$ are each independently selected from the group of hydrogen, a substituted or unsubstituted aryl group having 6 to 24 carbon atoms, a substituted or unsubstituted heteroaryl group having 1 to 24 carbon atoms, and a substituted or unsubstituted cycloalkyl group having 3 to 24 carbon atoms.

2. The organic light emitting device as claimed in claim 1, wherein, in the case that any of $X_1$ to $X_4$, R, $A_1$, and $A_2$ in the first compound are substituted, $X_1$ to $X_4$, R, $A_1$, or $A_2$ are independently selected from the group of an aryl group having 6 to 24 carbon atoms, a heteroaryl group having 2 to 24 carbon atoms, an alkyl group having 1 to 24 carbon atoms, a heteroalkyl group having 1 to 24 carbon atoms, a cycloalkyl group having 3 to 24 carbon atoms, an alkoxy group having 1 to 24 carbon atoms, a cyano group, a halogen group, an aryloxy group having 6 to 24 carbon atoms, an alkylsilyl group having 1 to 24 carbon atoms, an arylsilyl group having 6 to 24 carbon atoms, deuterium, and hydrogen.

3. The organic light emitting device as claimed in claim 1, wherein the first compound is a compound represented by the one of the following Formulae BD1 to BD6:

BD1 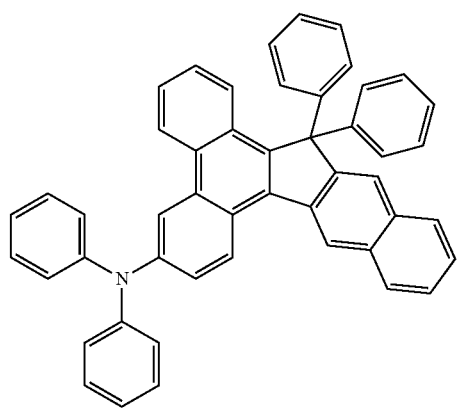
BD4 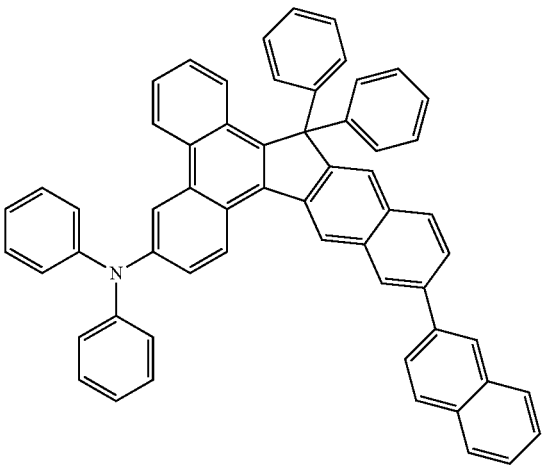
BD2 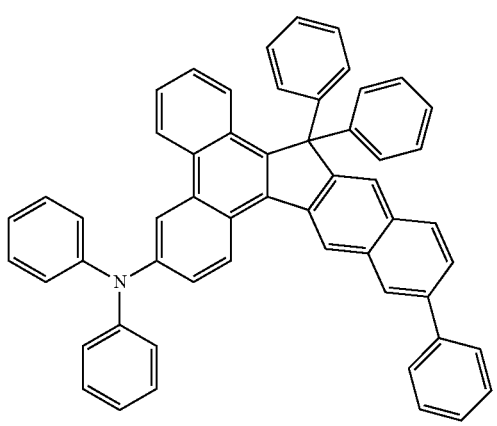
BD5 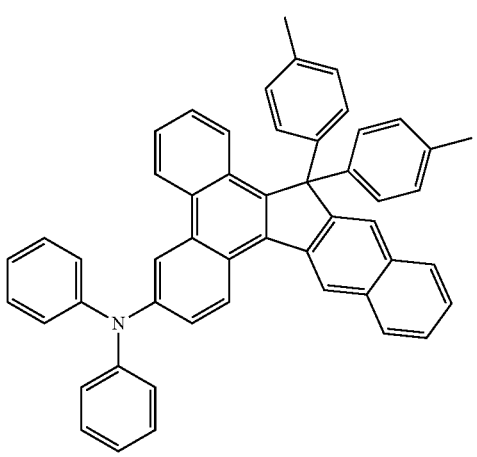
BD3 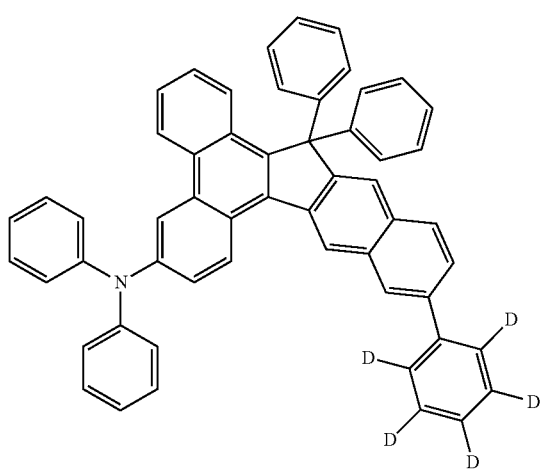
BD6 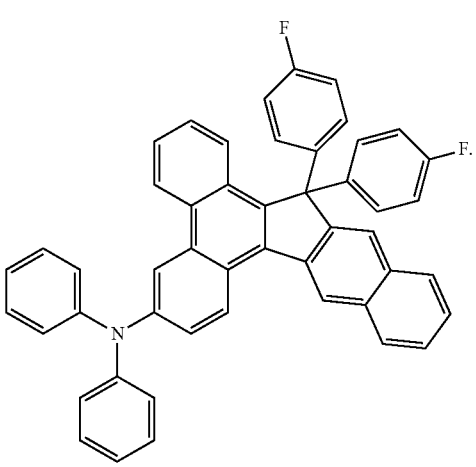
4. The organic light emitting device as claimed in claim 1, wherein the second compound is represented by the following Formula 3:

[Formula 3]

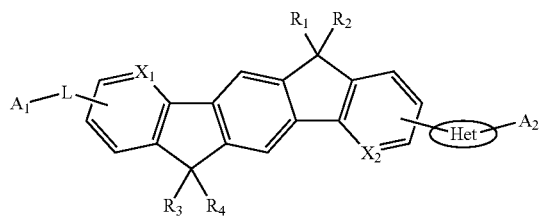

wherein, in Formula 3:
$X_1$ and $X_2$ are each independently $CR_5$ or N,
$R_1$ to $R_5$ are each independently selected from the group of hydrogen, deuterium, a substituted or unsubstituted alkyl group having 1 to 40 carbon atoms, a substituted or unsubstituted aryl group having 5 to 40 carbon atoms, a substituted or unsubstituted heteroaryl group having 5 to 40 carbon atoms, a substituted or unsubstituted aryloxy group having 5 to 40 carbon atoms, a substituted or unsubstituted alkyloxy group having 1 to 40 carbon atoms, a substituted or unsubstituted arylamino group having 5 to 40 carbon atoms, a substituted or unsubstituted diarylamino group having 5 to 40 carbon atoms, a substituted or unsubstituted arylalkyl group having 6 to 40 carbon atoms, a substituted or unsubstituted cycloalkyl group having 3 to 40 carbon atoms, and a substituted or unsubstituted heterocycloalkyl group having 3 to 40 carbon atoms; a group including a fused aliphatic ring, a group including a fused aromatic ring, a group including a fused heteroaliphatic ring, a group including a fused heteroaromatic ring, a halogen group, or a combination thereof,
L is selected from the group of a single bond, a substituted or unsubstituted arylene group having 5 to 30 carbon atoms, a substituted or unsubstituted fused arylene group having 10 to 30 carbon atoms, a substituted or unsubstituted heteroarylene group having 2 to 30 carbon atoms and including N, S, or O, a substituted or unsubstituted fused heteroarylene group having 5 to 30 carbon atoms and including N, S, or O,
Het is a substituted or unsubstituted heteroaryl group having 3 to 20 carbon atoms and including N, and
$A_1$ and $A_2$ are each independently hydrogen, a substituted or unsubstituted aryl group having 5 to 40 carbon atoms, or a substituted or unsubstituted heteroaryl group having 5 to 40 carbon atoms.

5. The organic light emitting device as claimed in claim 4, wherein the second compound is a compound represented by one of the following Formulae ET1 to ET18:

ET1

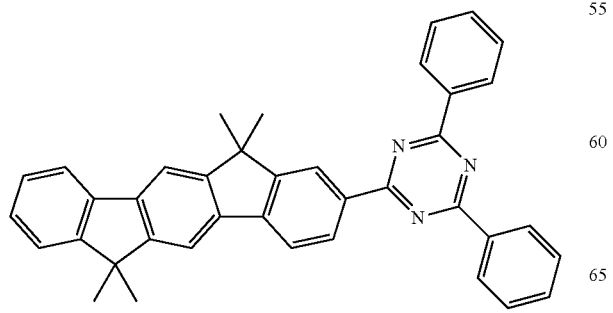

ET2

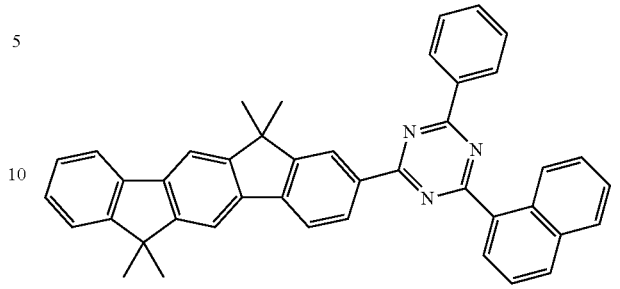

ET3

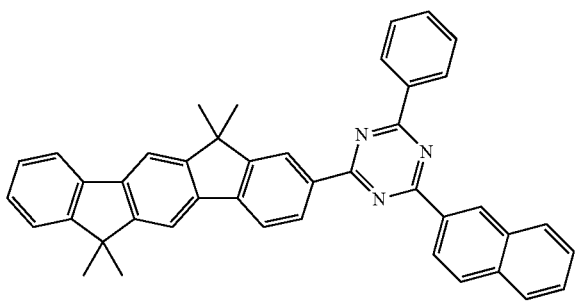

ET4

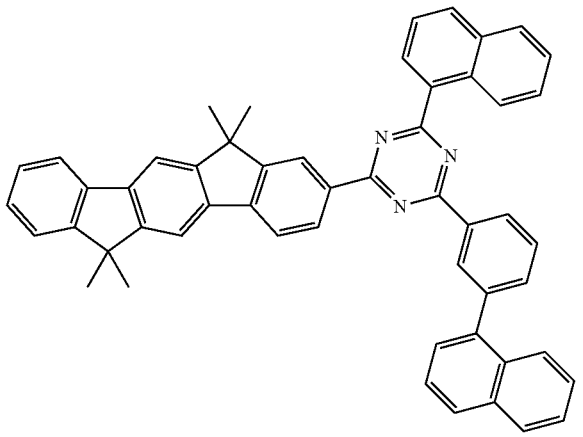

ET5

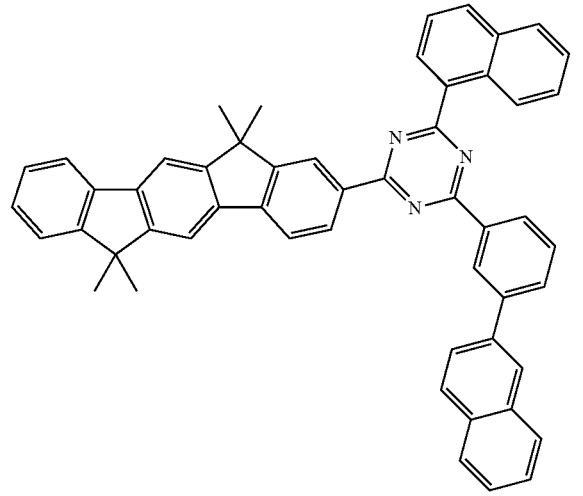

-continued
ET6
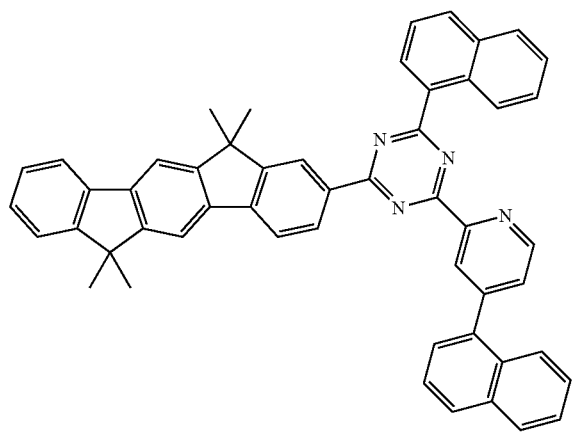
ET9
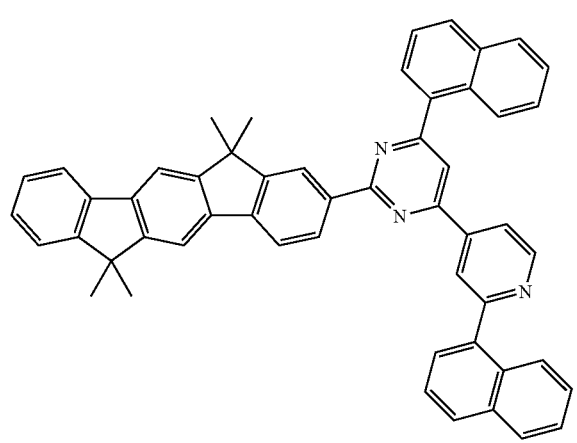
ET7
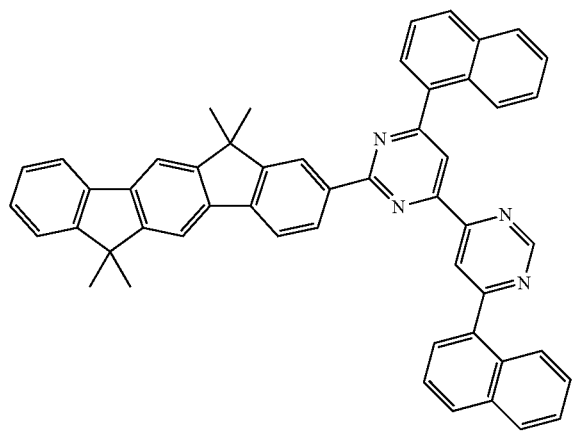
ET10
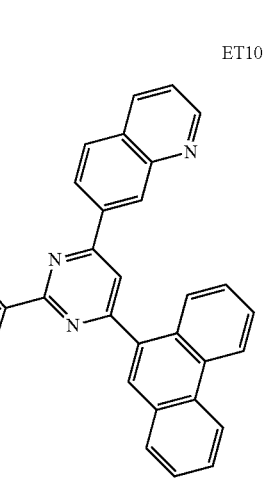
ET8
ET11
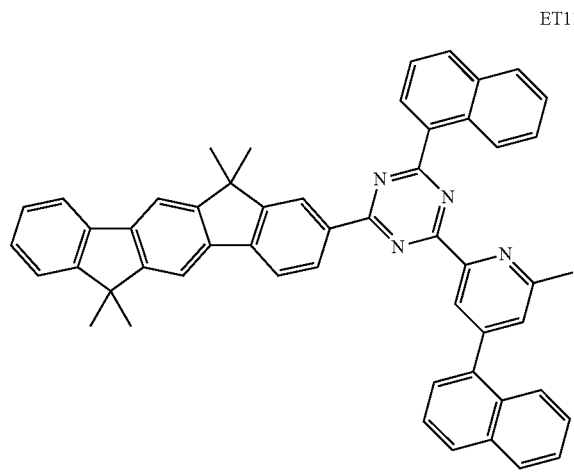

-continued
ET12
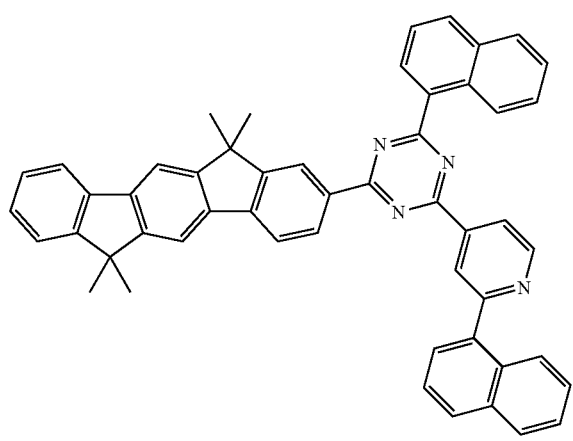
ET13
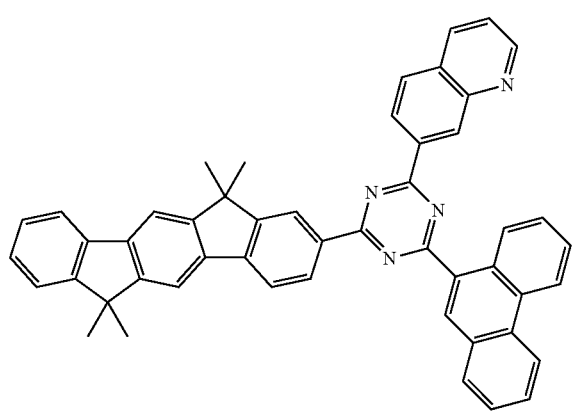
ET14
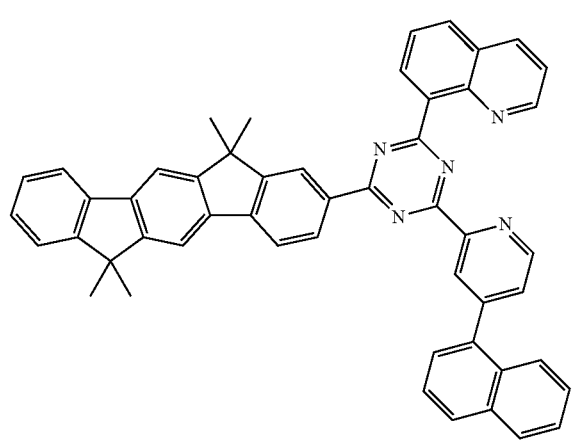
-continued
ET15
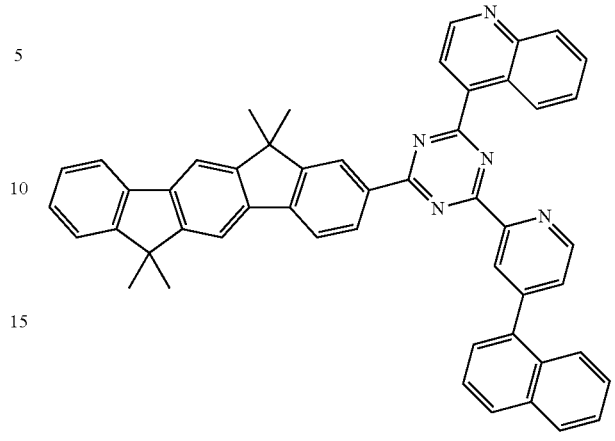
ET16
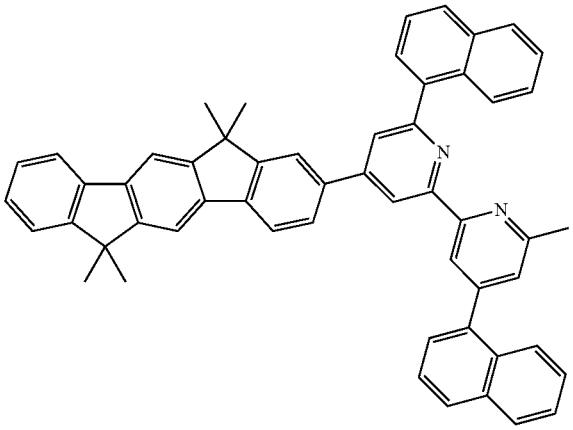
ET17
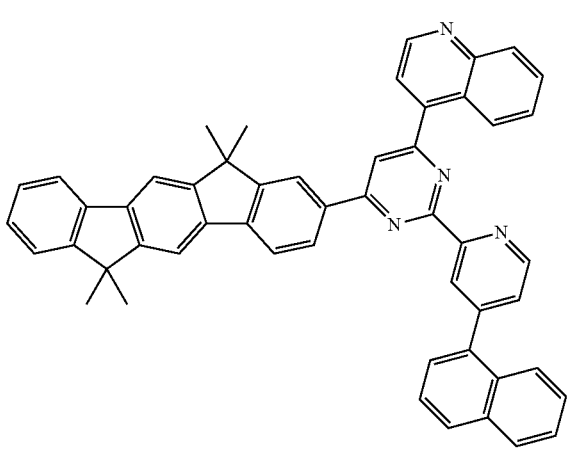

ET18

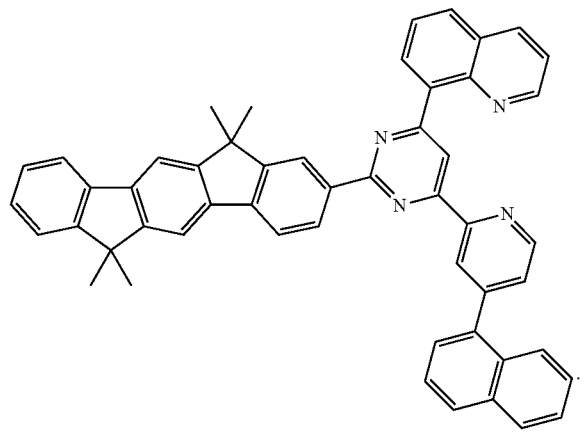

6. The organic light emitting device as claimed in claim 4, wherein the emission layer includes a host and a blue dopant, the blue dopant including the first compound.

7. The organic light emitting device as claimed in claim 6, wherein the host includes at least one of tris(8-quinolinorate)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and 2-methyl-9,10-bis(naphthalen-2-yl)anthracene (MADN).

8. The organic light emitting device as claimed in claim 1, further comprising a hole transport layer between the anode and the emission layer.

9. The organic light emitting device as claimed in claim 8, wherein the hole transport layer includes at least one of N-phenylcarbazole, polyvinylcarbazole, N,N'-bis(3-methylphenyl)-N,N'-diphenyl-[1,1-biphenyl]-4,4'-diamine (TPD), N,N'-di(1-naphthyl)-N,N'-diphenylbenzidine (NPB), 4,4',4''-tris(N-carbazolyl)triphenylamine (TCTA), and 4,4'-cyclohexylidene bis[N,N-bis(4-methylphenyl)benzenamine] (TAPC).

10. The organic light emitting device as claimed in claim 8, further comprising a hole injection layer between the anode and the hole transport layer.

11. The organic light emitting device as claimed in claim 10, wherein the hole injection layer includes at least one of N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-tris(N,N-diphenylamino)triphenylamine (TDATA), 4,4',4''-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), and polyaniline/camphor sulfonic acid (PANI/CSA), polyaniline/poly(4-styrenesulfonate) (PANI/PSS).

12. The organic light emitting device as claimed in claim 1, further comprising an electron injection layer between the electron transport layer and the cathode.

13. The organic light emitting device as claimed in claim 12, wherein the electron injection layer includes at least one of LiF, lithium quinolate (LiQ), $Li_2O$, BaO, NaCl and CsF.

14. A display device comprising a plurality of pixels, at least one of the pixels including:
an anode;
an emission layer on the anode, the emission layer including a first compound represented by the following Formula 1;
an electron transport layer on the emission layer, the electron transport layer including a second compound and the second compound including an indenofluorene derivative; and
a cathode on the electron transport layer,

[Formula 1]

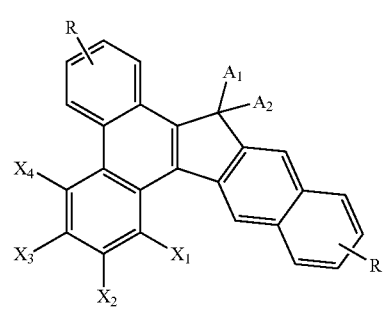

wherein, in Formula 1:
$X_1$ to $X_4$ are each independently selected from the group of a substituted or unsubstituted arylamino group having 6 to 24 carbon atoms, a substituted or unsubstituted aryl group having 6 to 24 carbon atoms, a substituted or unsubstituted heteroaryl group having 2 to 24 carbon atoms, a substituted or unsubstituted alkyl group having 1 to 24 carbon atoms, a substituted or unsubstituted heteroalkyl group having 1 to 24 carbon atoms, a substituted or unsubstituted cycloalkyl group having 1 to 24 carbon atoms, a substituted or unsubstituted alkoxy group having 1 to 24 carbon atoms, a cyano group, a halogen group, a substituted or unsubstituted aryloxy group having 6 to 24 carbon atoms, a substituted or unsubstituted alkylsilyl group having 1 to 24 carbon atoms, a substituted or unsubstituted arylsilyl group having 6 to 24 carbon atoms, deuterium, and hydrogen, and
R, $A_1$, and $A_2$ are each independently selected from the group of hydrogen, a substituted or unsubstituted aryl group having 6 to 24 carbon atoms, a substituted or unsubstituted heteroaryl group having 1 to 24 carbon atoms, and a substituted or unsubstituted cycloalkyl group having 3 to 24 carbon atoms.

15. The display device as claimed in claim 14, wherein, in the case that any of $X_1$ to $X_4$, R, $A_1$, and $A_2$ in the first compound are substituted, $X_1$ to $X_4$, R, $A_1$, and $A_2$ are independently selected from the group of an aryl group having 6 to 24 carbon atoms, a heteroaryl group having 2 to 24 carbon atoms, an alkyl group having 1 to 24 carbon atoms, a heteroalkyl group having 1 to 24 carbon atoms, a cycloalkyl group having 3 to 24 carbon atoms, an alkoxy group having 1 to 24 carbon atoms, a cyano group, a halogen group, an aryloxy group having 6 to 24 carbon atoms, an alkylsilyl group having 1 to 24 carbon atoms, an arylsilyl group having 6 to 24 carbon atoms, deuterium, and hydrogen.

16. The display device as claimed in claim 14, wherein the first compound is a compound represented by one of the following Formulae BD1 to BD6:

BD1
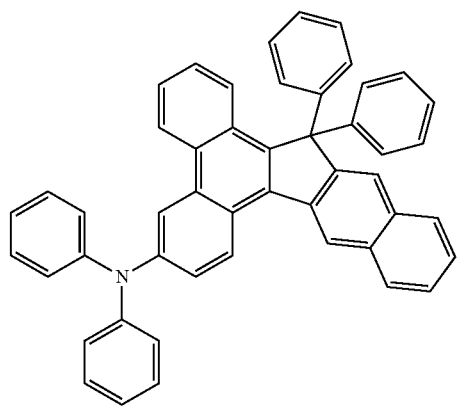
BD2
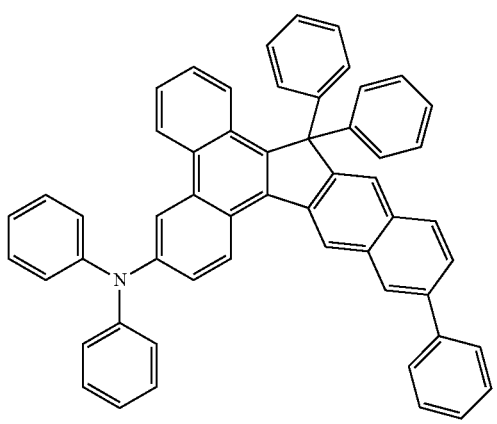
BD3
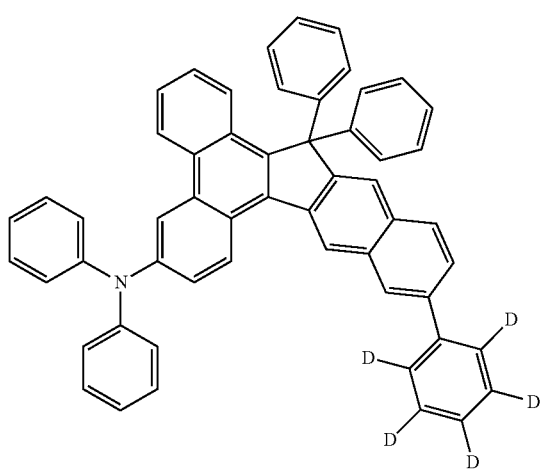
BD4
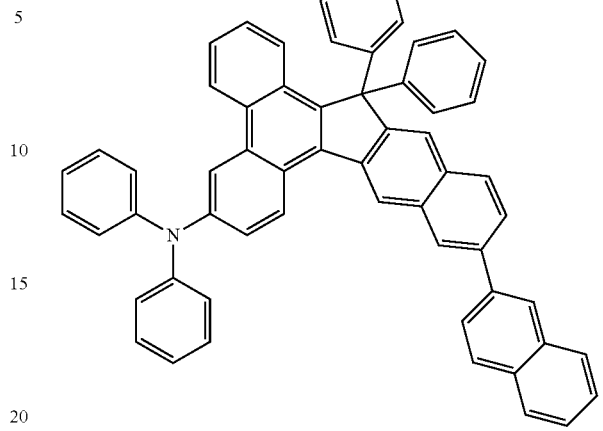
BD5
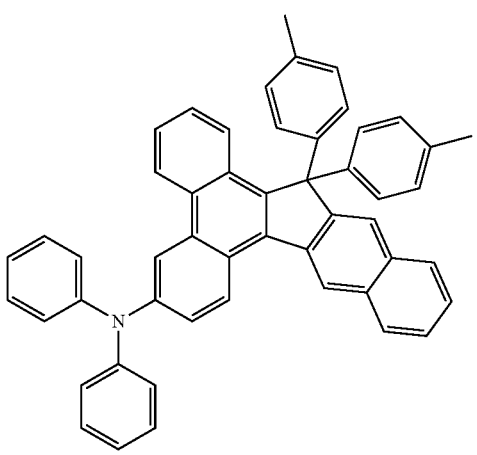
BD6
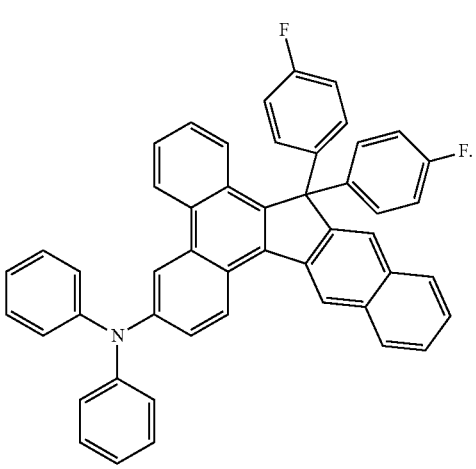
17. The display device as claimed in claim 14, wherein the second compound is represented by the following Formula 3:

[Formula 3]

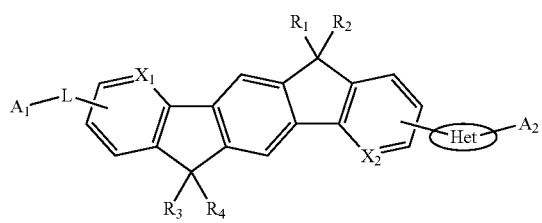

wherein, in Formula 3:
$X_1$ and $X_2$ are each independently $CR_5$ or N,
$R_1$ to $R_5$ are each independently selected from the group of hydrogen, deuterium, a substituted or unsubstituted alkyl group having 1 to 40 carbon atoms, a substituted or unsubstituted aryl group having 5 to 40 carbon atoms, a substituted or unsubstituted heteroaryl group having 5 to 40 carbon atoms, a substituted or unsubstituted aryloxy group having 5 to 40 carbon atoms, a substituted or unsubstituted alkyloxy group having 1 to 40 carbon atoms, a substituted or unsubstituted arylamino group having 5 to 40 carbon atoms, a substituted or unsubstituted diarylamino group having 5 to 40 carbon atoms, a substituted or unsubstituted arylalkyl group having 6 to 40 carbon atoms, a substituted or unsubstituted cycloalkyl group having 3 to 40 carbon atoms, and a substituted or unsubstituted heterocycloalkyl group having 3 to 40 carbon atoms; a group including a fused aliphatic ring, a group including a fused aromatic ring, a group including a fused heteroaliphatic ring, a group including a fused heteroaromatic ring, a halogen group or a combination thereof,
L is selected from the group of a single bond, a substituted or unsubstituted aryl group having 5 to 30 carbon atoms, a substituted or unsubstituted fused aryl group having 10 to 30 carbon atoms, a substituted or unsubstituted heteroaryl group having 2 to 30 carbon atoms and including N, S, or O, a substituted or unsubstituted fused heteroarylene group having 5 to 30 carbon atoms and including N, S, or O,
Het is a substituted or unsubstituted heteroaryl group having 3 to 20 carbon atoms and including N, and
$A_1$ and $A_2$ are each independently hydrogen, a substituted or unsubstituted aryl group having 5 to 40 carbon atoms, or a substituted or unsubstituted heteroaryl group having 5 to 40 carbon atoms.

18. The display device as claimed in claim 17, wherein the second compound is a compound represented by one of the following Formulae ET1 to ET18:

ET1

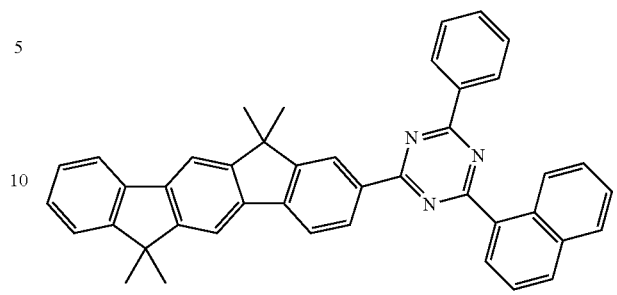

ET2

ET3

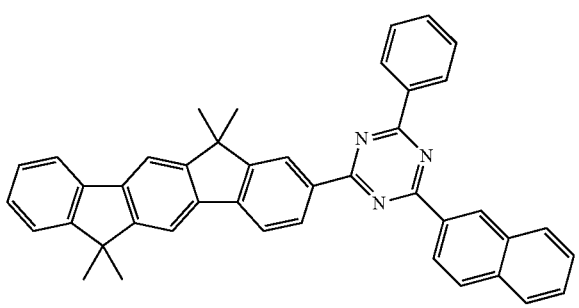

ET4

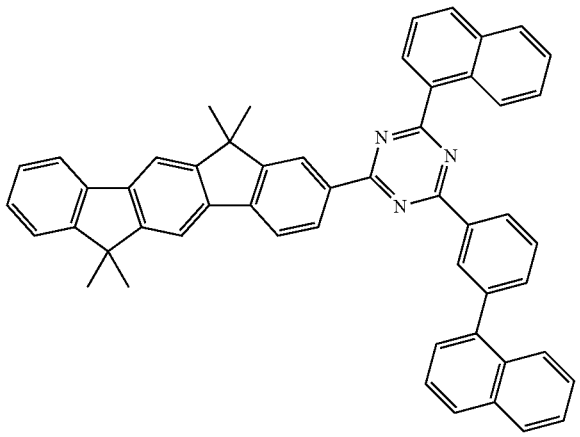

ET5

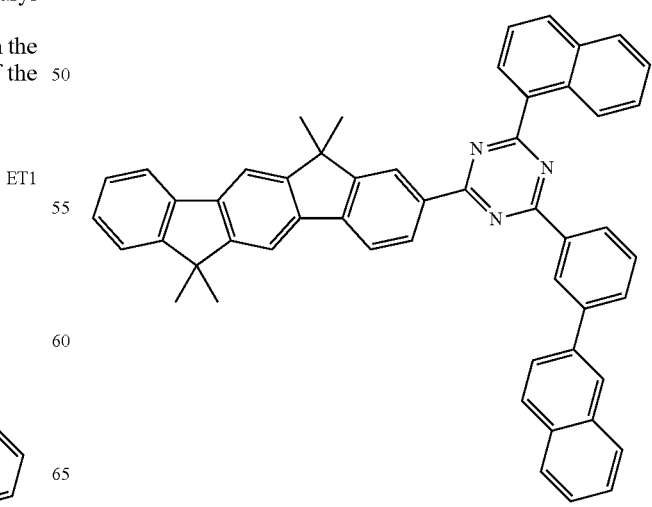

ET6
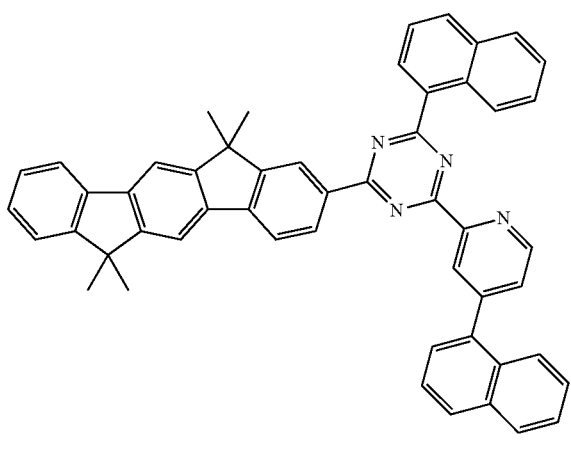
ET7
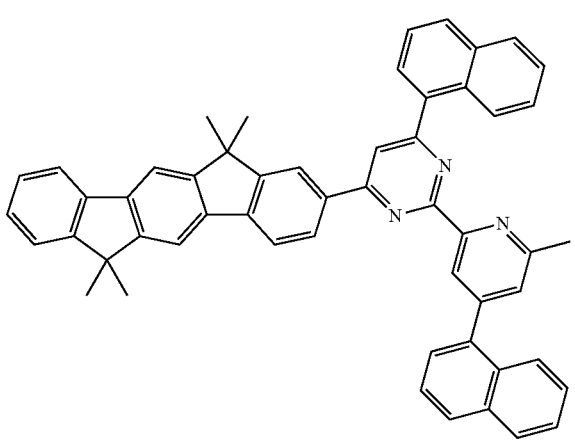
ET8
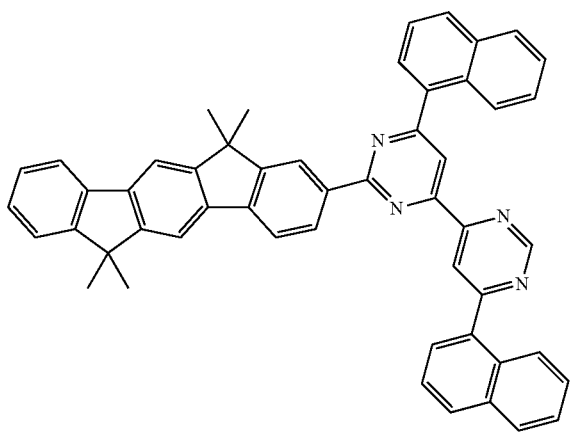
ET9
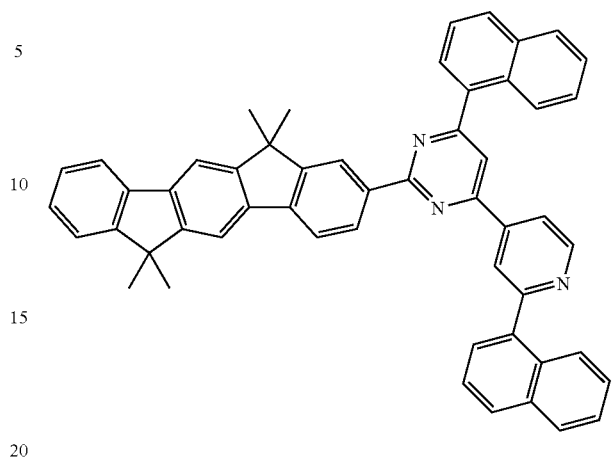
ET10
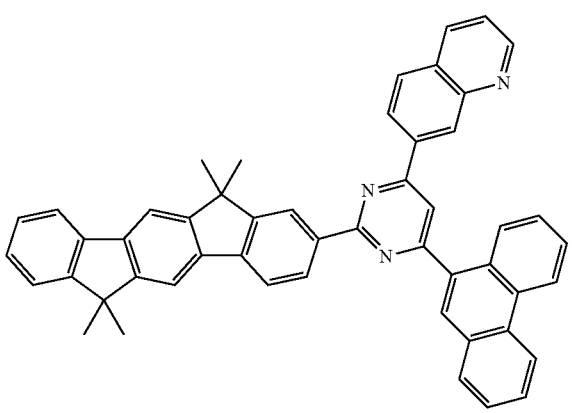
ET11
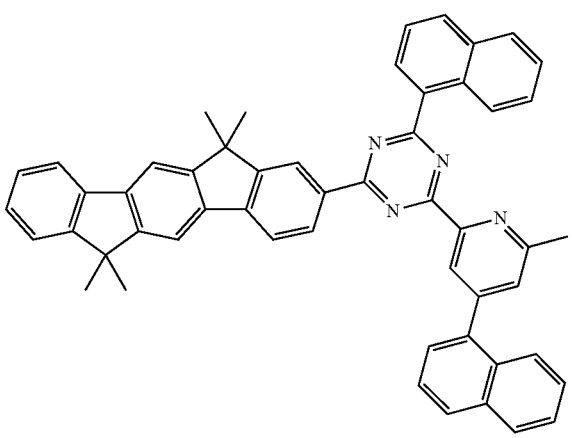

ET12
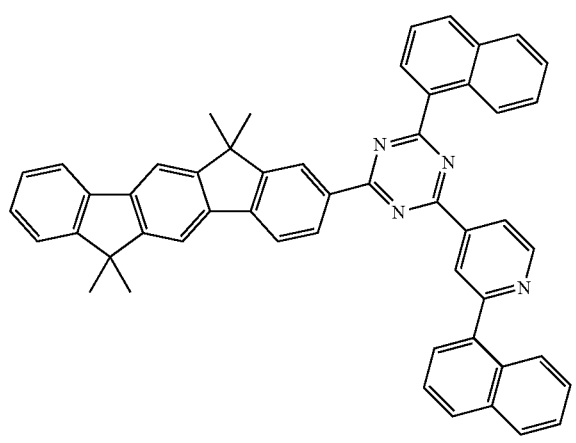
ET13
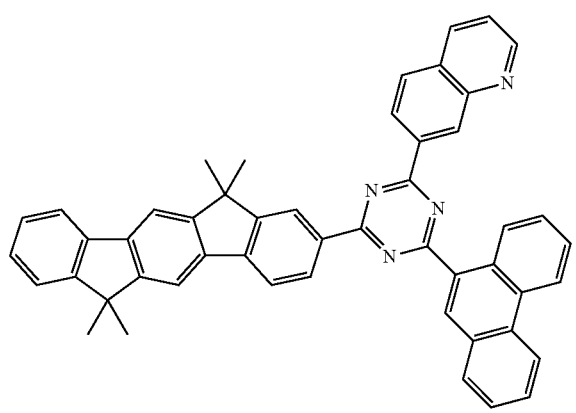
ET15
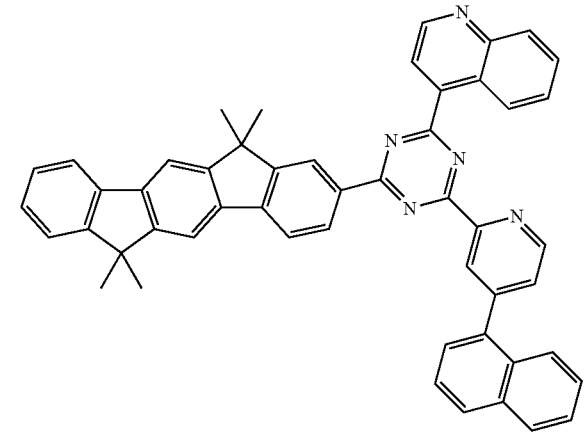
ET16
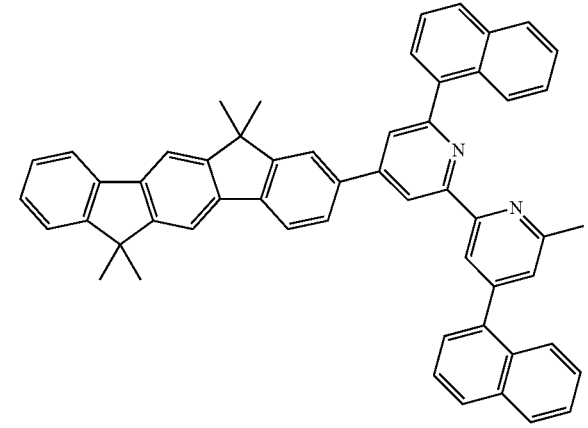
ET14
ET17
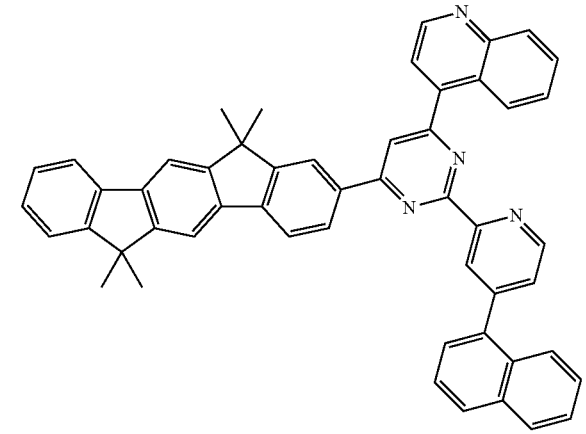

ET18

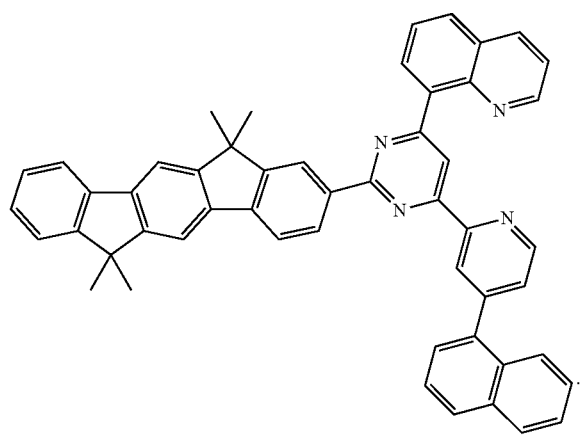

19. The display device as claimed in claim 14, wherein:
the emission layer includes a red dopant in another one of the pixels, and
the emission layer includes a green dopant in still another one of the pixels.

20. The display device as claimed in claim 19, wherein:
the red dopant includes at least one of Pt(II) octaethylporphine (PtOEP), tris(2-phenylisoquinoline)iridium (Ir(piq)$_3$), and bis(2-(2'-benzothienyl)-pyridinato-N,C3')iridium(acetylacetonate) (Btp$_2$Ir(acac)), and
the green dopant includes at least one of tris(2-phenylpyridine)iridium (Ir(ppy)$_3$), bis(2-phenylpyridine)(acetylacetonato)iridium(III) (Ir(ppy)$_2$(acac)), tris(2-(4-tolyl)phenylpyridine)iridium (Ir(mppy)$_3$), and 10-(2-benzothiazolyl)-1,1,7,7-tetramethyl-2,3,6,7-tetrahydro-1H,5H,11H-[1]benzopyrano[6,7,8-ij]-qunolizin-11-one (C545T).

* * * * *